(12) United States Patent
Lee et al.

(10) Patent No.: US 11,329,174 B2
(45) Date of Patent: May 10, 2022

(54) META OPTICAL DEVICES AND METHODS OF MANUFACTURING THE SAME

(71) Applicant: Samsung Electronics Co., Ltd., Suwon-si (KR)

(72) Inventors: Jeongyub Lee, Yongin-si (KR); Woong Ko, Seoul (KR); Changseung Lee, Yongin-si (KR); Hongkyu Park, Hwaseong-si (KR); Chanwook Baik, Yongin-si (KR); Hongseok Lee, Seoul (KR); Wonjae Joo, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/848,165

(22) Filed: Apr. 14, 2020

(65) Prior Publication Data
US 2021/0126142 A1 Apr. 29, 2021

(30) Foreign Application Priority Data
Oct. 24, 2019 (KR) .................. 10-2019-0133272

(51) Int. Cl.
*H01L 31/0352* (2006.01)
*H01L 27/144* (2006.01)
(Continued)

(52) U.S. Cl.
CPC .. *H01L 31/035281* (2013.01); *H01L 27/1443* (2013.01); *H01L 27/1446* (2013.01);
(Continued)

(58) Field of Classification Search
CPC ....... H01L 31/035281; H01L 31/02005; H01L 31/02019; H01L 31/022408;
(Continued)

(56) References Cited

U.S. PATENT DOCUMENTS 9,000,353 B2 * 4/2015 Seo .................. B82Y 20/00
250/226
10,431,613 B2 10/2019 Han et al.
(Continued)

FOREIGN PATENT DOCUMENTS

EP          2523220 A1      11/2012
KR   10-2018-0079979 A      7/2018
(Continued)

OTHER PUBLICATIONS

Park, Hyungsung et al., "Filter-Free Image Sensor Pixels Comprising Silicon Nanowires with Selective Color Absorption", Nano Letters, vol. 14, pp. 1804-1809, Mar. 3, 2014, dx.doi.org/10.1021/nl404379w.
(Continued)

*Primary Examiner* — Sitaramarao S Yechuri
(74) *Attorney, Agent, or Firm* — Harness, Dickey & Pierce, P.L.C.

(57) ABSTRACT

A meta optical device configured to sense incident light includes a plurality of nanorods each having a shape dimension less than a wavelength of the incident light. Each nanorod includes a first conductivity type semiconductor layer, an intrinsic semiconductor layer, and a second conductivity type semiconductor layer. The meta optical device may separate and sense wavelengths of the incident light.

22 Claims, 17 Drawing Sheets

(51) Int. Cl.
  *H01L 31/02*     (2006.01)
  *H01L 31/0224*   (2006.01)
  *H01L 31/0288*   (2006.01)
  *H01L 31/105*    (2006.01)
  *H01L 31/18*     (2006.01)

(52) U.S. Cl.
  CPC .. *H01L 31/02005* (2013.01); *H01L 31/02019* (2013.01); *H01L 31/0288* (2013.01); *H01L 31/022408* (2013.01); *H01L 31/105* (2013.01); *H01L 31/1804* (2013.01); *H01L 31/1864* (2013.01)

(58) Field of Classification Search
  CPC .............. H01L 31/0288; H01L 31/105; H01L 31/1804; H01L 31/1864; H01L 31/035227; H01L 27/1443; H01L 27/1446; H01L 27/14643; H01L 27/14601; G02B 1/002
  See application file for complete search history.

(56) References Cited

U.S. PATENT DOCUMENTS

| | | |
|---|---|---|
| 2010/0127153 A1* | 5/2010 | Agarwal ............. H01L 27/1446 250/200 |
| 2013/0075699 A1 | 3/2013 | Brown et al. |
| 2013/0223124 A1 | 8/2013 | Park et al. |
| 2013/0240348 A1 | 9/2013 | Mi et al. |
| 2015/0214261 A1 | 7/2015 | Park et al. |
| 2018/0190688 A1 | 7/2018 | Han et al. |
| 2018/0292585 A1 | 10/2018 | Yun et al. |
| 2019/0041260 A1 | 2/2019 | Zhang et al. |

FOREIGN PATENT DOCUMENTS

| | | | |
|---|---|---|---|
| KR | 10-2018-0113783 A | 10/2018 | |
| WO | WO-2012141141 A1 * | 10/2012 | ..... H01L 31/035281 |
| WO | WO-2017/132283 A1 | 8/2017 | |

OTHER PUBLICATIONS

Extended European Search Report dated Jan. 26, 2021 for corresponding European Application No. 20180218.8.

* cited by examiner (POLY-Si DEPOSITION)

(WAFER BONDING)

META OPTICAL DEVICES AND METHODS OF MANUFACTURING THE SAME

CROSS-REFERENCE TO RELATED APPLICATION

This application claims the benefit of Korean Patent Application No. 10-2019-0133272, filed on Oct. 24, 2019, in the Korean Intellectual Property Office, the disclosure of which is incorporated herein in its entirety by reference.

BACKGROUND

1. Field

The present disclosure relates to meta optical devices and methods of manufacturing the meta optical devices.

2. Description of Related Art

A meta structure refers to an artificial structure having a thickness, a pattern, or a period smaller than the wavelength of incident light and thus having optical characteristics that exceed physical constraints of diffraction.

Such meta structures may be applied to various optical devices, for example, image sensors.

In general, image sensors include photo diodes, organic dye-containing color filters, and microlenses that are formed on a substrate having a readout circuit. However, such an image sensor structure has a large volume and may thus be not suitable for high-resolution image sensors having a pixel size of about 1 μm or less, and moreover, the use of organic materials may lower thermal reliability.

SUMMARY

Provided are meta optical devices having small sizes and being capable of functioning as high-resolution image sensors.

Provided are methods of manufacturing the meta optical devices.

Additional aspects will be set forth in part in the description which follows and, in part, will be apparent from the description, or may be learned by practice of the presented example embodiments of the disclosure.

According to some example embodiments, a meta optical device configured to sense incident light may include a substrate, and a plurality of nanorods on the substrate. Each nanorod of the plurality of nanorods may have a shape dimension less than a wavelength of the incident light. Each nanorod of the plurality of nanorods may include a stack, in a first direction away from the substrate, of a first conductivity type semiconductor layer, an intrinsic semiconductor layer, and a second conductivity type semiconductor layer.

The plurality of nanorods may include at least two nanorods having different cross-sectional widths in a second direction that is perpendicular to the first direction.

The plurality of nanorods may include a plurality of first nanorods each having a first width in a cross-section in the second direction, a plurality of second nanorods each having a second width in a cross-section in the second direction, and a plurality of third nanorods each having a third width in a cross-section in the second direction.

The plurality of first nanorods may be configured to condense and sense light in a red wavelength band based on a magnitude of the first width. The plurality of second nanorods may be configured to condense and sense light in a green wavelength band based on a magnitude of the second width. The plurality of third nanorods may be configured to condense and sense light in a blue wavelength band based on a magnitude of the third width.

The second width may be greater than the third width, and the first width may be greater than the second width.

The first width, the second width, and the third width may each range from about 50 nm to about 200 nm.

A distance between centers of two adjacent nanorods of the plurality of nanorods may range from about 80 nm to about 500 nm.

In a plan view perpendicular to the first direction, a unit structure may be repeated in which any one nanorod of the plurality of first nanorods, the plurality of second nanorods, and the plurality of third nanorods are repeatedly arranged at a center and vertices of a hexagon.

In the unit structure, one first nanorod of the plurality of first nanorods may be positioned at the center of the hexagon, and three second nanorods of the plurality of second nanorods and three third nanorods of the plurality of third nanorods may be alternately arranged at six vertices of the hexagon.

The plurality of nanorods may be formed based on a silicon semiconductor, such that each of the first conductivity type semiconductor layer, the intrinsic semiconductor layer, and the second conductivity type semiconductor layer includes silicon.

The meta optical device may include a residual layer including $SiO_2$ and a first conductivity type dopant contained in the $SiO_2$, the residual layer being between the first conductivity type semiconductor layer and the substrate.

The plurality of nanorods may have a height equal to or less than about 200 nm.

The first conductivity type semiconductor layer and the second conductivity type semiconductor layer may each have a doping concentration within a range of $1\times10^{17}$ atoms/cm$^3$ to about $1\times10^{22}$ atoms/cm$^3$.

The first conductivity type semiconductor layer may include a p-type semiconductor layer, and the second conductivity type semiconductor layer may include an n-type semiconductor layer.

An n-type dopant included in the second conductivity type semiconductor layer may include an element having an atomic weight equal to or greater than about 70.

The n-type dopant may include arsenic (As) or antimony (Sb).

The meta optical device may further include a cladding layer between the plurality of nanorods and surrounding the plurality of nanorods, the cladding layer including a material having a lower refractive index than respective refractive indices of the plurality of nanorods.

The cladding layer may include $SiO_2$, $Si_3N_4$, or $Al_2O_3$.

The meta optical device may further include a common electrode layer that is in contact with the second conductivity type semiconductor layers of the plurality of nanorods.

The substrate may include a readout circuit substrate including a plurality of transistors electrically connected to separate, respective nanorods of the plurality of nanorods.

The meta optical device may further include an isolation layer between the readout circuit substrate and the plurality of nanorods, the isolation layer including a material which has a lower refractive index than respective refractive indices of the plurality of nanorods; and conductive vias penetrating the isolation layer and electrically connecting the first conductivity type semiconductor layers of separate, respective nanorods of the plurality of nanorods to separate, respective transistors of the plurality of transistors of the readout circuit substrate.

The meta optical device may further include a plurality of lower electrode layers that are in contact with lower surfaces of the first conductivity type semiconductor layers of separate, respective nanorods of the plurality of nanorods.

The meta optical device may further include an isolation layer between the readout circuit substrate and the lower electrode layers, the isolation layer including a material which has a lower refractive index than respective refractive indices of the plurality of nanorods; and conductive vias penetrating the isolation layer and electrically connecting separate, respective transistors of the plurality of transistors of the readout circuit substrate to separate, respective lower electrode layers of the lower electrode layers.

An electronic device may include the meta optical device.

A method of manufacturing a meta optical device may include preparing a dopant-containing layer, the dopant-containing layer including a first conductivity type dopant, forming a crystalline silicon layer on the dopant-containing layer, forming a first conductivity type semiconductor layer based on performing a first heat treatment process on the crystalline silicon layer, implanting a second conductivity type dopant into the crystalline silicon layer, and forming a second conductivity type semiconductor layer based on performing a second heat treatment process on the crystalline silicon layer that is implanted with the second conductivity type dopant.

The method may include manufacturing an electronic device that includes the meta optical device.

The preparing of the dopant-containing layer may include implanting the first conductivity type dopant into a silicon oxide substrate.

The preparing of the dopant-containing layer may include forming a borosilicate glass (BSG) layer on a silicon oxide substrate.

The forming of the crystalline silicon layer may include depositing a polycrystalline silicon material on the dopant-containing layer.

The forming of the crystalline silicon layer may include bonding a silicon-on-insulator (SOI) substrate to the dopant-containing layer, the SOI substrate including a first monocrystalline silicon layer, an insulating material layer, and a second monocrystalline silicon layer, removing the second monocrystalline silicon layer from the SOI substrate, and removing the insulating material layer from the SOI substrate.

The method may further include depositing a silicon oxide layer on the dopant-containing layer, prior to bonding the SOI substrate to the dopant-containing layer, to bond the SOI substrate and the dopant-containing layer together.

The method may further include forming a silicon oxide layer on the crystalline silicon layer prior to the implanting of the second conductivity type dopant into the crystalline silicon layer.

The method may further include removing the silicon oxide layer from the second conductivity type semiconductor layer subsequently to performing the second heat treatment process.

The first conductivity type dopant may include a p-type dopant, and the second conductivity type dopant may include an n-type dopant.

The n-type dopant may include an element having an atomic weight equal to or greater than about 70.

The method may further include patterning the first conductivity type semiconductor layer, the crystalline silicon layer, the second conductivity type semiconductor layer to form a plurality of nanorods that are electrically isolated from each other.

The plurality of nanorods may have a particular shape distribution that causes the plurality of nanorods to be configured to function as lenses and color filters.

According to some example embodiments, a meta optical device configured to sense incident light may include a nanorod having a shape dimension less than a wavelength of the incident light, the nanorod including a stack of a first conductivity type semiconductor layer, an intrinsic semiconductor layer, and a second conductivity type semiconductor layer.

The nanorod may be formed based on a silicon semiconductor, such that each of the first conductivity type semiconductor layer, the intrinsic semiconductor layer, and the second conductivity type semiconductor layer includes silicon.

The meta optical device may further include a residual layer including $SiO_2$ and a first conductivity type dopant contained in the $SiO_2$, the residual layer being in contact with the first conductivity type semiconductor layer.

The nanorod may have a height equal to or less than about 200 nm.

The first conductivity type semiconductor layer and the second conductivity type semiconductor layer may each have a doping concentration within a range of $1\times10^{17}$ atoms/cm$^3$ to about $1\times10^{22}$ atoms/cm$^3$.

The first conductivity type semiconductor layer may include a p-type semiconductor layer, and the second conductivity type semiconductor layer may include an n-type semiconductor layer.

An n-type dopant included in the second conductivity type semiconductor layer may include an element having an atomic weight equal to or greater than about 70.

The n-type dopant may include arsenic (As) or antimony (Sb).

The meta optical device may further include a cladding layer surrounding nanorod, the cladding layer including a material having a lower refractive index than a refractive index of the nanorod.

The cladding layer may include $SiO_2$, $Si_3N_4$, or $Al_2O_3$.

An electronic device may include the meta optical device.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
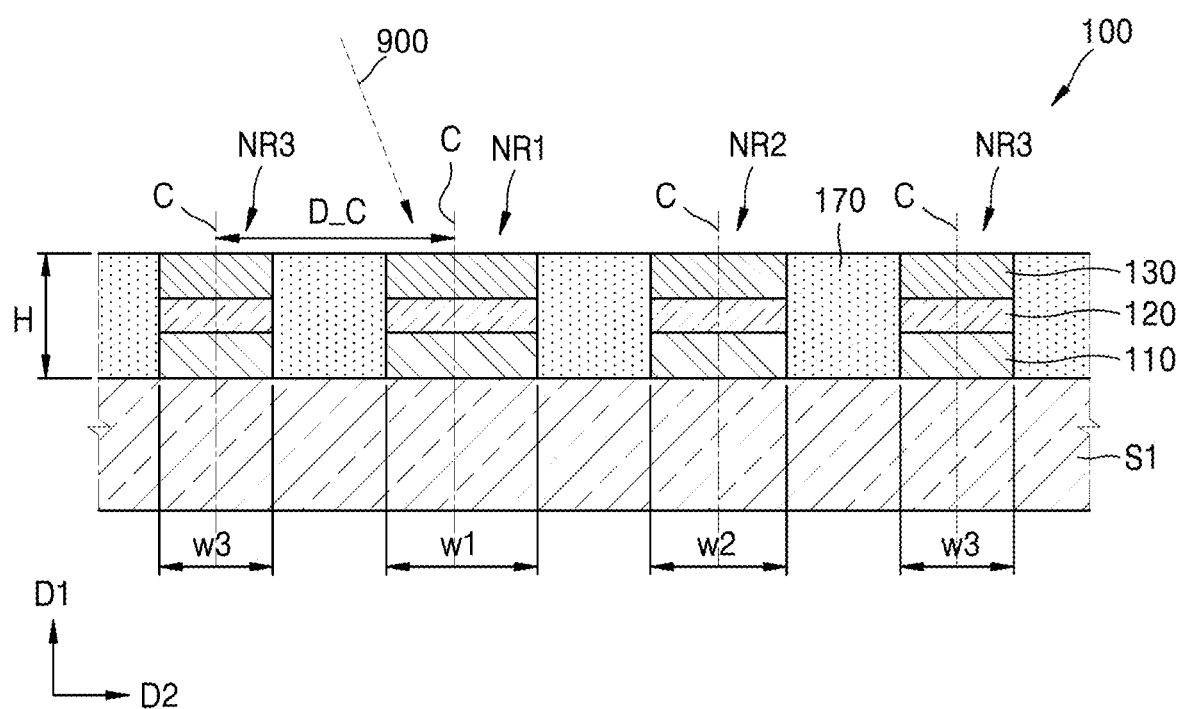
FIG. 1 is a cross-sectional view illustrating a schematic structure of a meta optical device according to some example embodiments.

Reference will now be made in detail to example embodiments, some of which are illustrated in the accompanying drawings, wherein like reference numerals refer to like elements throughout. In this regard, the some example embodiments may have different forms and should not be construed as being limited to the descriptions set forth herein. Accordingly, some example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, some example embodiments will be described with reference to the accompanying drawings. Some example embodiments described herein are for illustrative purposes only, and various modifications may be made therefrom. In the drawings, like reference numerals refer to like elements, and the sizes of elements may be exaggerated for clarity of illustration.

In the following description, when an element is referred to as being "above" or "on" another element, it may be directly on the other element while making contact with the other element or may be above the other element without making contact with the other element (e.g., "indirectly" on the other element).

Although the terms "first" and "second" are used to describe various elements, these terms are only used to distinguish one element from another element. These terms do not limit elements to having different materials or structures.

The terms of a singular form may include plural forms unless otherwise mentioned. It will be further understood that the terms "comprises" and/or "comprising" used herein specify the presence of stated features or elements, but do not preclude the presence or addition of one or more other features or elements.

In the present disclosure, terms such as "unit" or "module" may be used to denote a unit that has at least one function or operation and is implemented with hardware, software, or a combination of hardware and software.

An element referred to with the definite article or a demonstrative pronoun may be construed as the element or the elements even though it has a singular form.

Operations of a method may be performed in appropriate order unless explicitly described in terms of order or described to the contrary. In addition, example or exemplary terms (for example, "such as" and "etc.") are used for the purpose of description and are not intended to limit the scope of the present disclosure unless defined by the claims.

Figure 2:
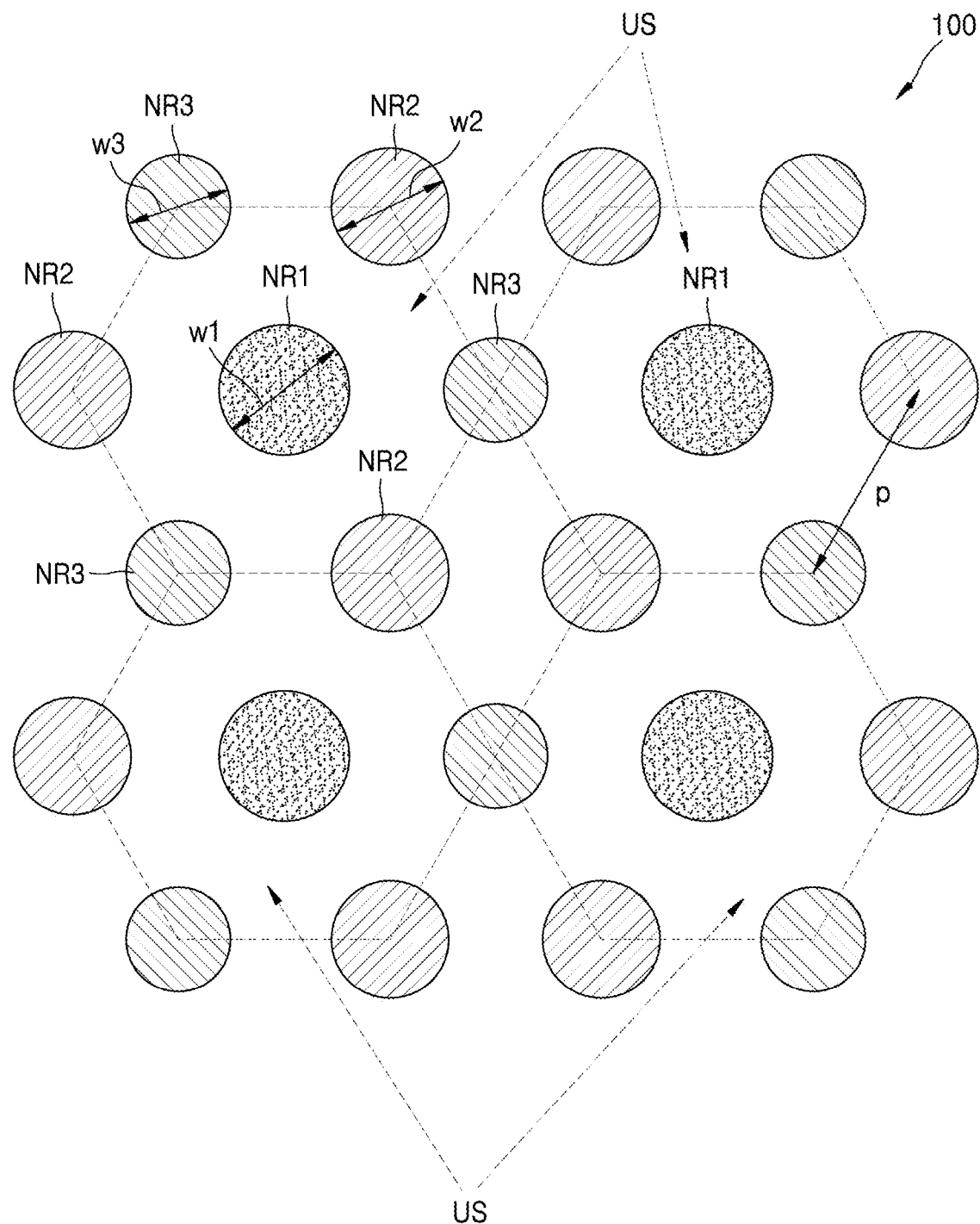
FIG. 2 is a plan view illustrating a schematic structure of a meta optical device according to some example embodiments.

FIG. 1 is a cross-sectional view showing a schematic structure of a meta optical device 100 according to some example embodiments, and FIG. 2 is an example plan view of the meta optical device 100 shown in FIG. 1.

The meta optical device 100 is configured to sense incident light 900 (e.g., light that is incident on the meta optical device 100). Referring to FIG. 1, the meta optical device 100 includes a substrate S1 and a plurality of nanorods NR1, NR2, and NR3. Each of the nanorods NR1, NR2, and NR3 has a shape dimension (e.g., a cross-sectional width, height, or the like) less than the wavelength of incident light 900 and senses (e.g., is configured to sense) the incident light 900. In some example embodiments, the substrate S1 may be omitted, and the meta optical device 100 may further include one or more nanorods NR1, NR3, and NR3, with or without the cladding layer 170 shown in FIG. 1. For example, in some example embodiments, a meta optical device 100 may include a single nanorod (e.g., NR1) without any cladding layer 170 and without the substrate S1.

The nanorods NR1, NR2, and NR3 may have a vertical photodiode form. Referring to FIGS. 1 and 2, each of the nanorods NR1, NR2, and NR3 includes a first conductivity type semiconductor layer 110, an intrinsic semiconductor layer 120, and a second conductivity type semiconductor layer 130 that are stacked in a direction away from a substrate S1 (e.g., a first direction D1), that is, in a height (H) direction (e.g., direction D1) of the nanorods NR1, NR2, and NR3.

The meta optical device 100 includes two or more nanorods having different cross-sectional widths in a cross-section in a direction perpendicular to the height (H) direction (e.g., second direction D2). As shown in FIGS. 1 and 2, the meta optical device 100 includes: a plurality of first nanorods NR1 each having a first width w1 in a cross-section in a direction perpendicular to the stacked direction (e.g., the second direction D2); a plurality of second nanorods NR2 each having a second width w2 in a cross-section in a direction perpendicular to the stacked direction (e.g., the second direction D2); and a plurality of third nanorods NR3 each having a third width w3 in a cross-section in a direction perpendicular to the stacked direction (e.g., the second direction D2), where the first, second, and third widths w1, w2, and w3 are different from each other. However, these kinds of nanorods having different widths are non-limiting examples. The meta optical device 100 may include two, four, or more kinds of nanorods having different widths.

The first, second, and third nanorods NR1, NR2, and NR3 may each have a height (H) of about 200 nm or less (e.g., equal to or less than about 200 nm).

The first nanorods NR1, the second nanorods NR2, and the third nanorods NR3 may be alternately arranged. The first width w1, the second width w2, and the third width w3 are set such that the first nanorods NR1, the second nanorods NR2, and the third nanorods NR3 may condense and sense light in a red wavelength band, a green wavelength band, and a blue wavelength band, respectively. Restated, the plurality of first nanorods NR1 may be configured to condense and sense light in a red wavelength band based on a magnitude of the first width w1, the plurality of second nanorods NR2 may be configured to condense and sense light in a green wavelength band based on a magnitude of the second width w2, and the plurality of third nanorods NR3 may be configured to condense and sense light in a blue wavelength band based on a magnitude of the third width w3.

The first width w1, the second width w2, and the third width w3 may have a relationship of w1>w2>w3, such that the second width w2 is greater than the third width w3, and the first width w1 is greater than the second width w2. The first width w1, the second width w2, and the third width w3 may each range from about 50 nm to about 200 nm. For example, the first width w1 may range from about 130 nm to about 140 nm for condensing and sensing light in the red wavelength band, the second width w2 may range from about 115 nm to about 125 nm for condensing and sensing light in the green wavelength band, and the third width w3 may range from about 100 nm to about 110 nm for condensing and sensing light in the blue wavelength band. However, these are non-limiting examples.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The distance D_C between the centers (e.g., center vertical axes C) of two adjacent nanorods among the plurality of nanorods may range from about 80 nm to about 500 nm.

Referring to the plan view of FIG. 2 which is perpendicular to the height (H) direction (e.g., perpendicular to the first direction D1), the meta optical device 100 may have a unit structure US that is repeated in which any one nanorod of the first nanorods NR1, the second nanorods NR2, and the third nanorods NR3 is repeatedly arranged at the center and vertices of a hexagon. The hexagon may be a regular hexagon having a side length p.

In some example embodiments, in the unit structure US, one of the first nanorods NR1 may be positioned at the center of the hexagon, and three of the second nanorods NR2 and three of third nanorods NR3 may be alternately arranged at the six vertices of the hexagon.

However, this array pattern is merely a non-limiting example. In another example, the first nanorods NR1, the second nanorods NR2, and the third nanorods NR3 may be alternately arranged in a rectangular matrix form. In some example embodiments, a Bayer array pattern may be employed to alternately arrange the first and second nanorods NR1 and NR2 in odd rows, and the second and third nanorods NR2 and NR3 in even rows.

The first, second, and third nanorods NR1, NR2, and NR3 are illustrated as having a cylindrical shape, but are not limited thereto. For example, the first, second, and third nanorods NR1, NR2, and NR3 may have a polygonal pillar shape such as a rectangular pillar shape or a hexagonal pillar shape.

The substrate S1 may include a dielectric material, and for example, the substrate S1 may be a $SiO_2$ substrate.

The first, second, and third nanorods NR1, NR2, and NR3 may be formed based on a silicon semiconductor, such that each of the first conductivity type semiconductor layer 110, the intrinsic semiconductor layer 120, and the second conductivity type semiconductor layer 130 includes silicon. In some example embodiments, the first conductivity type semiconductor layer 110 may include a p-type semiconductor layer and the second conductivity type semiconductor layer 130 may include an n-type semiconductor layer. For example, the first conductivity type semiconductor layer 110 may be a p-Si layer. The intrinsic semiconductor layer 120 may be an i-Si layer. The second conductivity type semiconductor layer 130 may be an n-Si layer.

A p-type dopant included in the first conductivity type semiconductor layer 110 may be boron (B). An n-type dopant included in the second conductivity type semiconductor layer 130 may be an element having an atomic weight of equal to or greater than about 70, for example, arsenic (As) or antimony (Sb). As described herein, an "atomic weight" may be a standard atomic weight, which is unitless.

Owing to the selection of the n-type dopant having an atomic weight of about 70 or greater, when a PIN junction structure having a low height (small thickness) is formed, the thickness of the intrinsic semiconductor layer 120 and the thickness of the second conductivity type semiconductor layer 130, which is of an n-type, may be easily set to desired values. When an element having a low atomic weight is used as a dopant, the depth of penetration may excessively increase during dopant implantation and heat treatment processes, and thus, a desired junction structure may not be easily formed.

The first conductivity type semiconductor layer 110 and the second conductivity type semiconductor layer 130 may each have a doping concentration of about $1\times10^{17}$ atoms/$cm^3$ to about $1\times10^{22}$ atoms/$cm^3$.

Although the first conductivity type semiconductor layer 110 and the second conductivity type semiconductor layer 130 are described as being of a p-type and an n-type, respectively, this is merely an example. For example, the first conductivity type semiconductor layer 110 may be an n-Si layer, and the second conductivity type semiconductor layer 130 may be a p-Si layer.

A cladding layer 170 may surround each nanorod of the meta optical device 100. The cladding layer 170 may be further provided in a region between the first, second, and third nanorods NR1, NR2, and NR3. The cladding layer 170 may include a material having a refractive index less than the respective refractive indices of the first, second, and third nanorods NR1, NR2, and NR3 and may surround the first, second, and third nanorods NR1, NR2, and NR3. The cladding layer 170 may include $SiO_2$, $Si_3N_4$, or $Al_2O_3$.

The first conductivity type semiconductor layers 110, the intrinsic semiconductor layers 120, and the second conductivity type semiconductor layers 130, which form the first, second, and third nanorods NR1, NR2, and NR3, may have a structure including no oxide interlayer, that is, an oxidation-free structure. Oxide interlayer may be formed by surface oxidation during manufacturing processes, and when there is an oxide interlayer, it may be difficult to obtain a desired thickness or performance. Operations for forming the meta optical device 100 having the first, second, and third nanorods NR1, NR2, and NR3 without any oxide interlayer will be described later with reference to FIG. 8 according to some example embodiments.

The first, second, and third nanorods NR1, NR2, and NR3 having a PIN diode structure may sense light incident thereon. In addition, the first, second, and third nanorods NR1, NR2, and NR3 may have different sub-wavelength shape dimensions and different phase modulation effects depending on the wavelength of incident light, and may separate and condense incident light according to the wavelength of the incident light. Owing to this, the meta optical device 100 may operate as a light detection sensor having the functions of a color filter and a condensing lens.

Various modifications of the meta optical device 100 will now be described.

Figure 3:
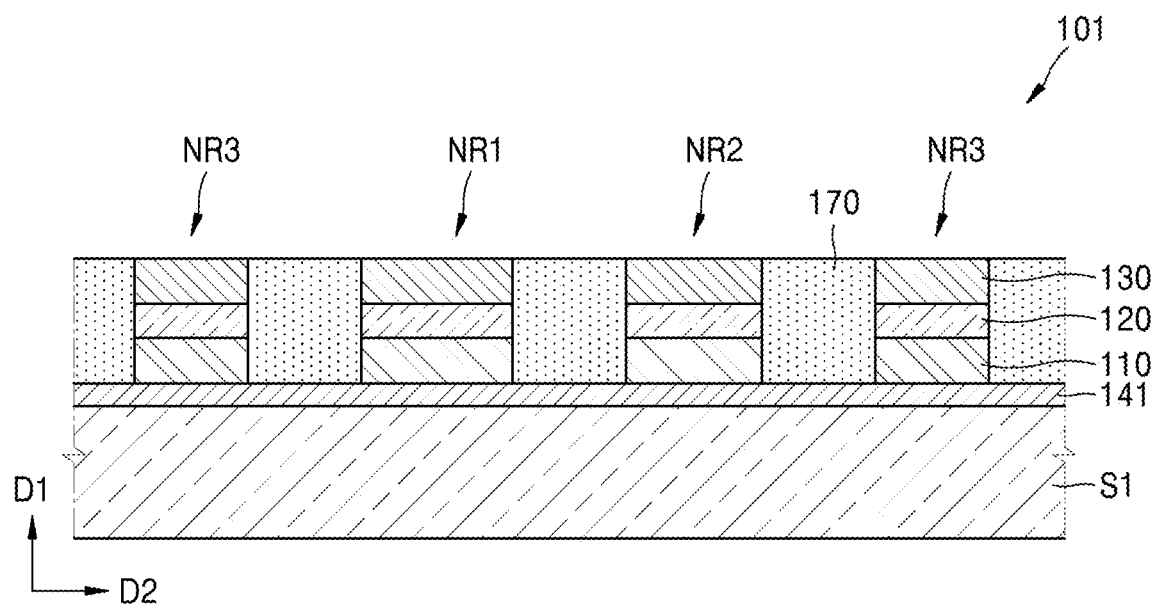
FIG. 3 is a cross-sectional view illustrating a schematic structure of a meta optical device according to some example embodiments.

FIG. 3 is a cross-sectional view illustrating a schematic structure of a meta optical device 101 according to some example embodiments.

The meta optical device 101 may further include a residual layer 141 in contact with first conductivity type semiconductor layers 110 (e.g., between a substrate S1 and first conductivity type semiconductor layers 110 (e.g., based on the plurality of nanorods NR1, NR2, NR3 being formed based on a silicon semiconductor)). The residual layer 141 is a layer in which a first conductivity type dopant is contained in a material (for example, $SiO_2$) of the substrate S1. Restated, the residual layer 141 may include a material of the substrate S1 (e.g., $SiO_2$) and a first conductivity type dopant contained within said material (e.g., $SiO_2$). For example, when the first conductivity type semiconductor layers 110 are p-Si layers, a layer in which a p-type dopant is contained in $SiO_2$ may be formed between the substrate S1 including $SiO_2$ and the first conductivity type semiconductor layers 110. This results from the process of forming the first conductivity type semiconductor layers 110 by implanting a p-type dopant into the substrate S1, forming a crystalline silicon layer on the substrate S1, and performing a heat treatment. When the first conductivity type semiconductor layers 110 are n-Si layers, the residual layer 141 may be a layer in which an n-type dopant is contained in $SiO_2$. Although the residual layer 141 is illustrated as being entirely present between the substrate S1 and a plurality of nanorods NR1, NR2, and NR3 and between the substrate S1 and a cladding layer 170, the form and thickness of the residual layer 141 shown in FIG. 4 are non-limiting examples.

Figure 4:
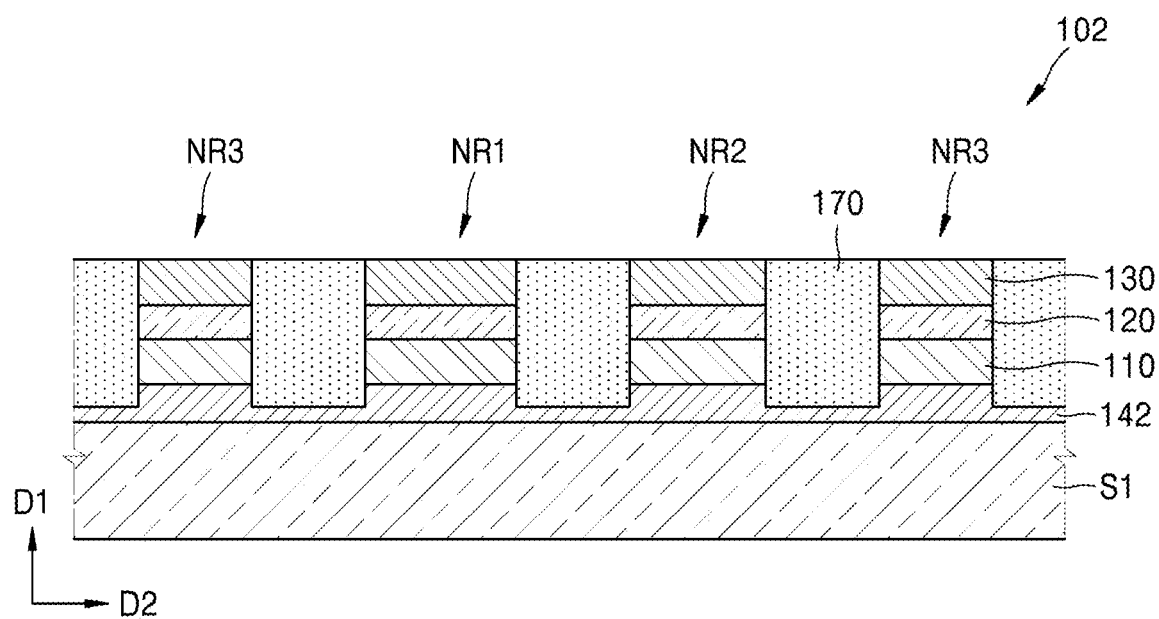
FIG. 4 is a cross-sectional view illustrating a schematic structure of a meta optical device according to some example embodiments.

FIG. 4 is a cross-sectional view illustrating a schematic structure of a meta optical device 102 according to some example embodiments.

The meta optical device 102 is different from the meta optical device 101 shown in FIG. 3, in terms of the form of a residual layer 142 formed between a substrate S1 and a plurality of nanorods NR1, NR2, and NR3. As shown in FIG. 4, the residual layer 142 may be patterned under first conductivity type semiconductor layers 110 such that the residual layer 142 may have widths corresponding to the first conductivity type semiconductor layers 110.

In addition, the residual layer 142 may be between the substrate S1 and the nanorods NR1, NR2, and NR3 but may not be in a region between the substrate S1 and a cladding layer 170.

In the following descriptions of embodiments, the residual layers 141 and 142 will not be shown, but the residual layers 141 and 142 shown in FIGS. 3 and 4 or modifications thereof may be included in the following embodiments.

Figure 5:
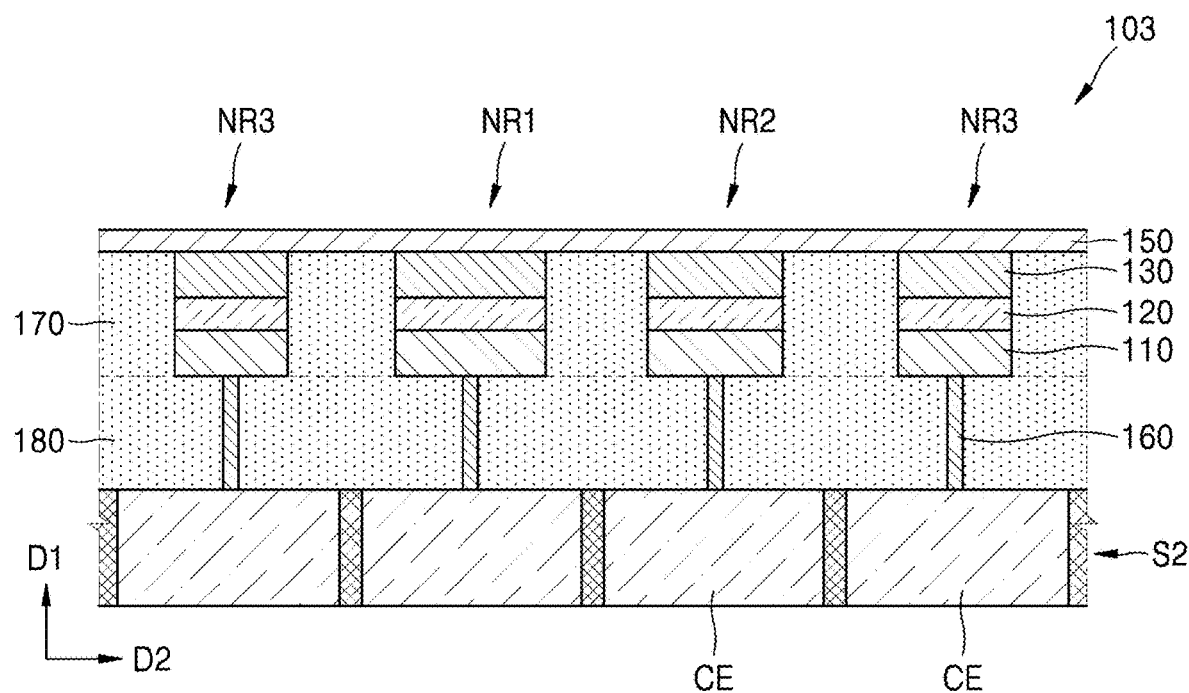
FIG. 5 is a cross-sectional view illustrating a schematic structure of a meta optical device according to some example embodiments.

FIG. 5 is a cross-sectional view illustrating a schematic structure of a meta optical device 103 according to some example embodiments.

The meta optical device 103 may further include additional elements to operate as an image sensor.

A plurality of nanorods NR1, NR2, and NR3 may be arranged on a readout circuit substrate S2, and a common electrode layer 150 may be arranged on the nanorods NR1, NR2, and NR3 while being a single, continuous layer that is in contact with the second conductivity type semiconductor layers 130 of each of the nanorods NR1, NR2, and NR3. The common electrode layer 150 may function as a common ground electrode for the nanorods NR1, NR2, and NR3. The common electrode layer 150 may include a transparent conductive material. For example, the common electrode layer 150 may include a transparent conductive oxide such as indium tin oxide (ITO), indium zinc oxide (IZO), aluminum zinc oxide (AZO), gallium indium zinc oxide (GIZO), or gallium zinc oxide (GZO), or may include graphene.

An isolation layer 180 may be arranged between the readout circuit substrate S2 and the nanorods NR1, NR2, and NR3, and conductive vias 160 may be formed between the readout circuit substrate S2 and the nanorods NR1, NR2, and NR3 in such a manner that the conductive vias 160 penetrates the isolation layer 180 to electrically connect the nanorods NR1, NR2, and NR3 to the readout circuit substrate S2.

The readout circuit substrate S2 includes a plurality of circuit elements CE. The circuit elements CE may include various circuit elements such as transistors for distinguishably detecting electrical signals generated in the nanorods NR1, NR2, and NR3. Accordingly, in some example embodiments, the readout circuit substrate S2 may include a plurality of transistors (e.g., CE) that are electrically connected to separate, respective nanorods of the nanorods NR1, NR2, and NR3.

The isolation layer 180 may include a material having a refractive index less than the respective refractive indices of the nanorods NR1, NR2, and NR3. The isolation layer 180 may include $SiO_2$, $Si_3N_4$, or $Al_2O_3$. The isolation layer 180 may include the same material as a material included in a cladding layer 170, but is not limited thereto.

The conductive vias 160 electrically connect the nanorods NR1, NR2, and NR3 to the circuit elements CE, respectively. For example, separate, respective transistors included in the circuit elements CE may be electrically respectively connected to separate, respective nanorods NR1, NR2, and NR3 through separate, respective conductive vias 160.

Figure 6:
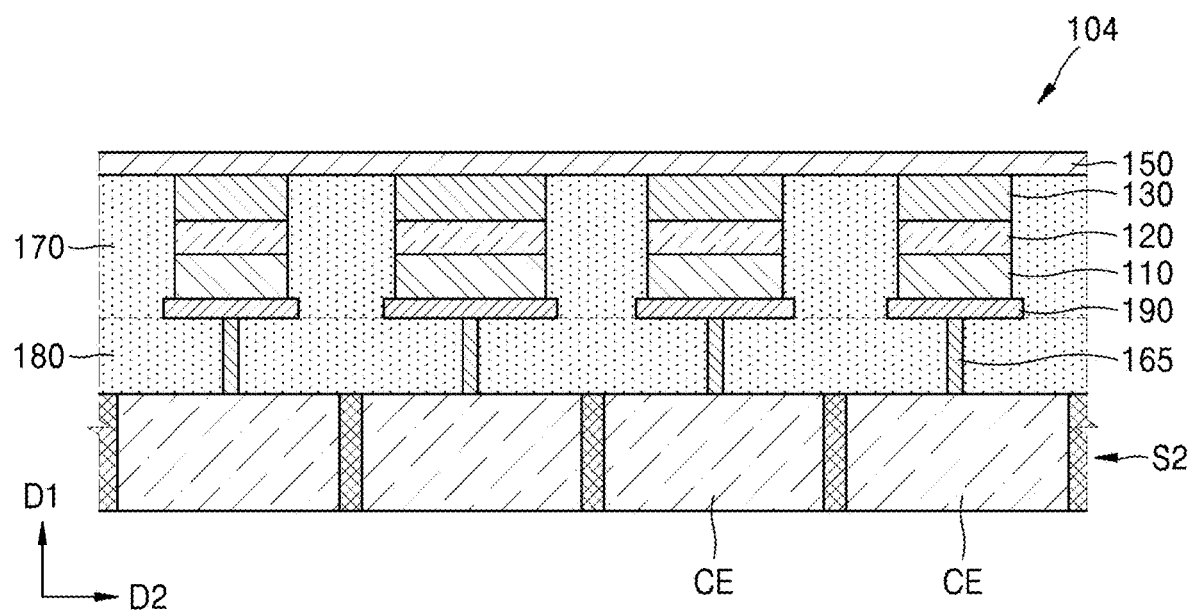
FIG. 6 is a cross-sectional view illustrating a schematic structure of a meta optical device according to some example embodiments.

FIG. 6 is a cross-sectional view illustrating a schematic structure of a meta optical device 104 according to some example embodiments.

The meta optical device 104 of the example embodiments shown in FIG. 6 is different from the meta optical device 103 shown in FIG. 5, in that the meta optical device 104 further includes lower electrode layers 190, which are in contact with first conductivity type semiconductor layers 110 of separate, respective nanorods of a plurality of nanorods NR1, NR2, and NR3. The lower electrode layers 190 are electrically connected to separate, respective circuit elements CE (e.g., transistors) of a readout circuit substrate S2 through separate, respective conductive vias 165 penetrating an isolation layer 180.

Figure 7:
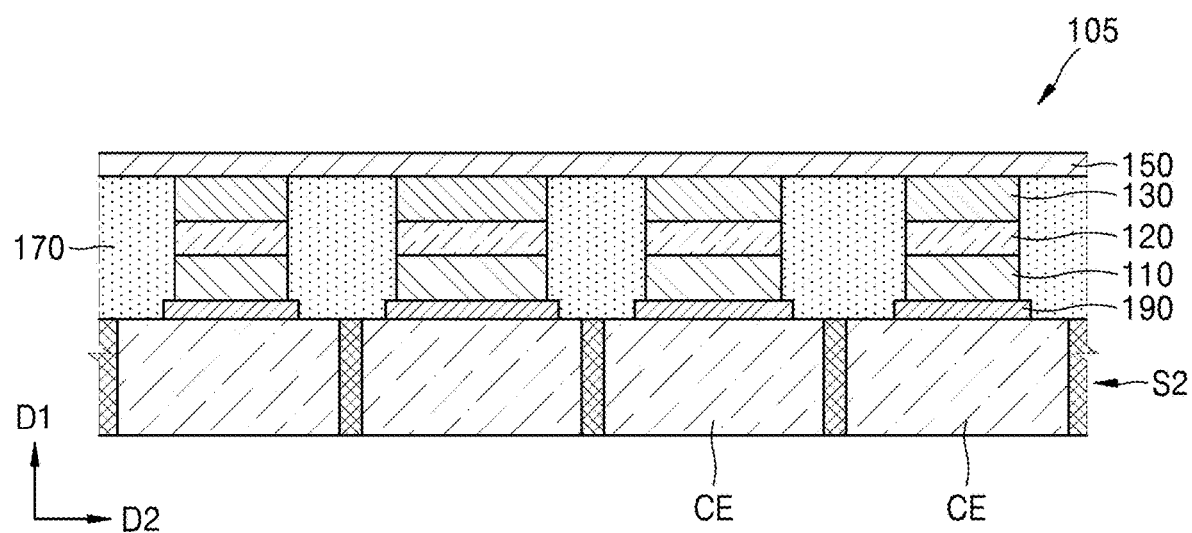
FIG. 7 is a cross-sectional view illustrating a schematic structure of a meta optical device according to some example embodiments.

FIG. 7 is a cross-sectional view illustrating a schematic structure of a meta optical device 105 according to some example embodiments.

The meta optical device 105 of the example embodiments shown in FIG. 7 is different from the meta optical device 104 shown in FIG. 6, in that the conductive vias 165 and the isolation layer 180 included in the meta optical device 104 is not included in the meta optical device 105.

Lower electrode layers 190 may be directly formed on a readout circuit substrate S2 and may be electrically connected to circuit elements CE of the readout circuit substrate S2.

The meta optical devices 100, 101, 102, 103, 104, and 105 described above may be applied to various electronic devices. For example, the meta optical devices 100, 101, 102, 103, 104, and 105 may be used as image sensors or used to constitute imaging devices together with imaging lenses, or may be applied to various electronic devices which employ imaging devices.

Figure 15:
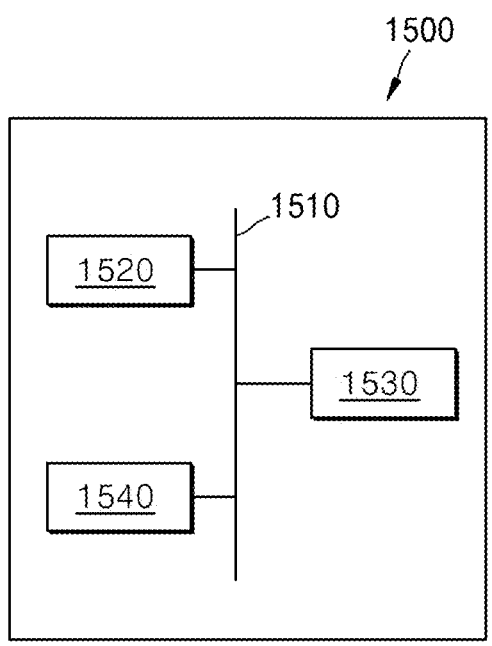
FIG. 15 shows a schematic of an electronic device according to some example embodiments.

FIG. 15 shows a schematic of an electronic device that may include the aforementioned meta optical device(s) according to some example embodiments.

As shown, the electronic device 1500 includes one or more electronic device components, including a processor (e.g., processing circuitry) 1520 and a memory 1530 that are communicatively coupled together via a bus 1510.

The processing circuitry 1520, may be included in, may include, and/or may be implemented by one or more instances of processing circuitry such as hardware including logic circuits, a hardware/software combination such as a processor executing software; or a combination thereof. For example, the processing circuitry 1620 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 1530 may include a non-transitory computer readable storage device, for example a solid state drive (SSD), storing a program of instructions, and the processing circuitry 1520 may be configured to execute the program of instructions to implement the functionality of the electronic device 1500.

In some example embodiments, the electronic device 1500 may include one or more additional components 1540, coupled to bus 1510, which may include, for example, a power supply, a light sensor, an imaging device, a light-emitting device, any combination thereof, or the like. In some example embodiments, one or more of the processing circuitry 1520, memory 1530, or one or more additional components 1540 may include any meta optical device according to any of the example embodiments described herein.

Figure 8:
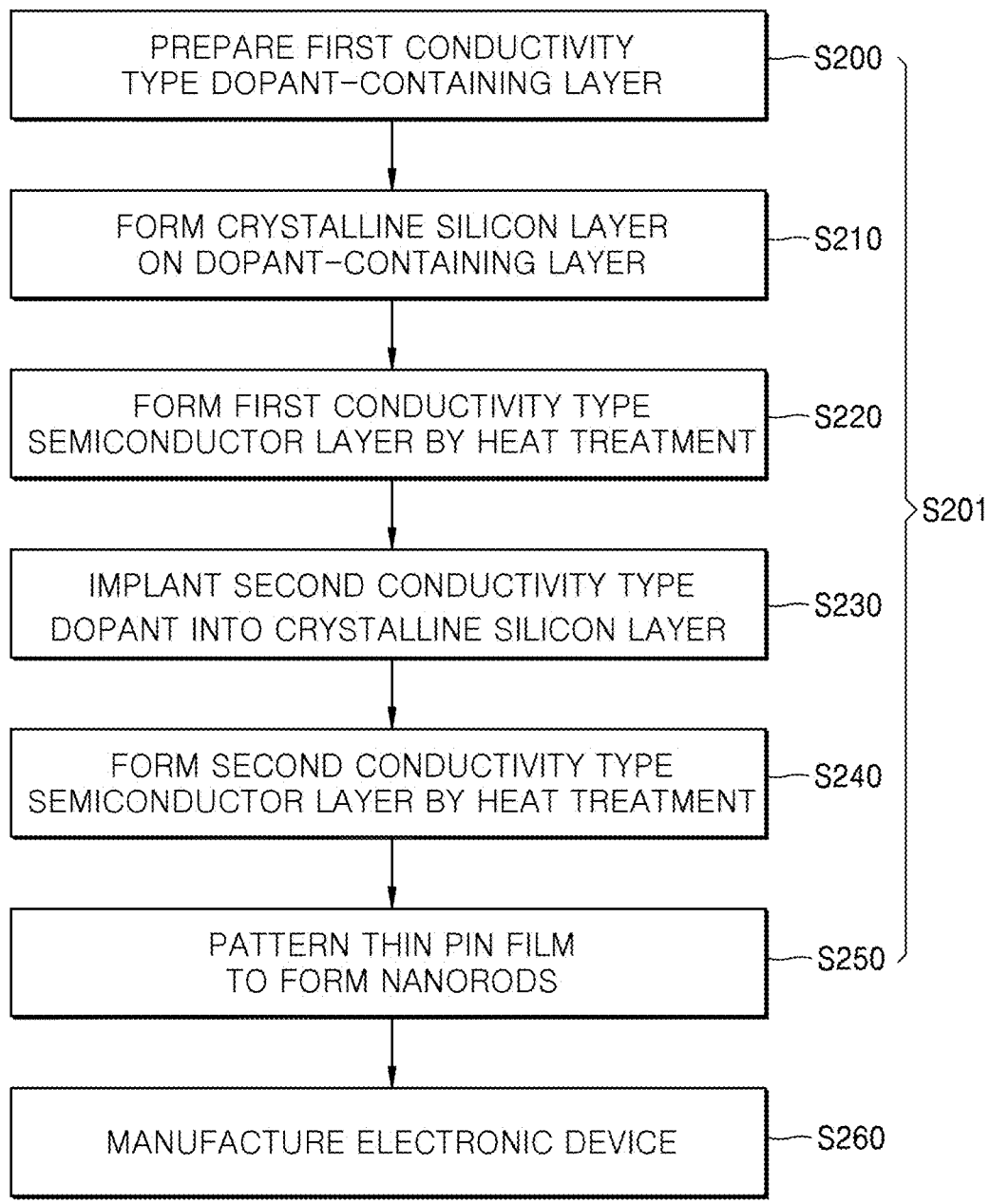
FIG. 8 is a flowchart schematically illustrating a method according to some example embodiments.

FIG. 8 is a flowchart schematically illustrating a method of manufacturing a meta optical device and/or an electronic device according to some example embodiments. The method may include a first operation of manufacturing a meta optical device (S201) and a second operation of manufacturing an electronic device that includes the meta optical device (S260).

Referring to FIG. 8, to manufacture a meta optical device, a dopant-containing layer which has a first conductivity type dopant is first prepared (S200). The first conductivity type may be a p-type or an n-type. Boron (B) may be used as a p-type dopant, and arsenic (As) or antimony (Sb) may be used as an n-type dopant.

Next, a crystalline silicon layer is formed on the prepared dopant-containing layer (S210). The crystalline silicon layer may include, for example, polycrystalline silicon or monocrystalline silicon.

Next, a first conductivity type semiconductor layer is formed by heat treatment (S220). The heat treatment may be performed through a rapid thermal process (RTP). The heat treatment causes the dopant of the dopant-containing layer to move to a region of the crystalline silicon layer, thereby forming n-Si or p-Si.

Next, a second conductivity type dopant is implanted into the crystalline silicon layer (S230), and a second conductivity type semiconductor layer is formed by heat treatment (S240). That is, a part of a region of the crystalline silicon layer into which the second conductivity type dopant is implanted turns into n-Si or p-Si by the heat treatment.

A thin PIN film formed through operations S200 to S240 may be patterned to form a plurality of nanorods having a desired shape distribution (S250).

An electronic device (e.g., any of the electronic devices as described herein, including the electronic device 1500 shown in FIG. 15) may be manufactured wherein the meta optical device formed in operation S201 is incorporated into one or more electronic device components of the electronic device (e.g., an imaging device 1540), according to any well-known methods for manufacturing electronic device components, that are assembled to form the finished electronic device (S260) according to any well-known methods for manufacturing finished electronic devices.

Hereinafter, the operations described with reference to FIG. 8 will be further described.

Figure 9A:
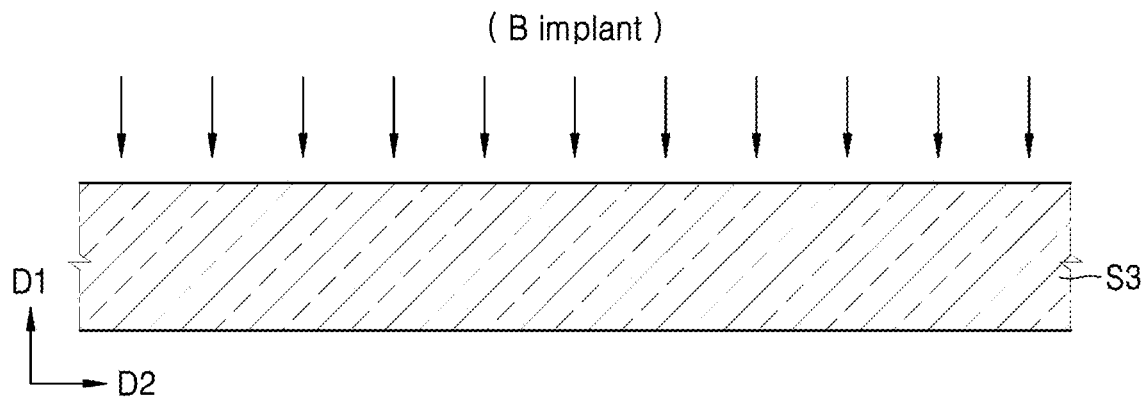
FIGS. 9A, 9B, and 9C are example views illustrating an operation of forming a first conductivity type dopant-containing layer in a method of manufacturing the meta optical device, according to some example embodiments.
Figure 9B:
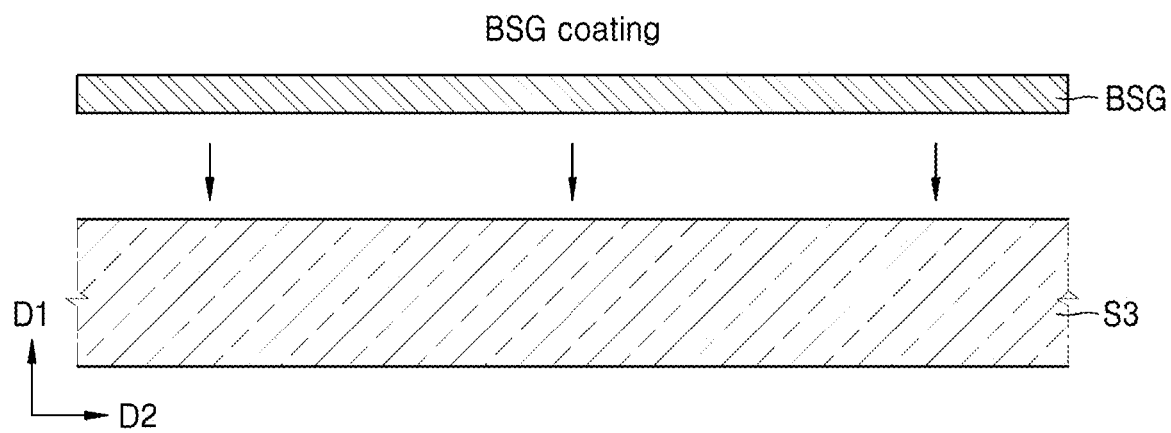
Figure 9C:
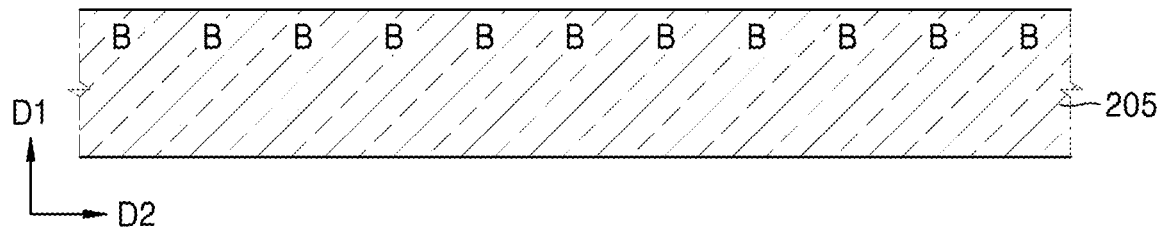

FIGS. 9A, 9B, and 9C are example views illustrating operation S200 of preparing a first conductivity type dopant-containing layer.

Referring to FIG. 9A, a first conductivity type dopant may be implanted into a substrate S3. For example, the substrate S3 may be a silicon substrate. In another example, the substrate S3 may be a silicon oxide substrate. The first conductivity type dopant may a p-type dopant, boron (B). However, this is a non-limiting example.

In some example embodiments, as shown in FIG. 9B, the substrate S3 may be coated with borosilicate glass (BSG), such that the dopant containing layer may be formed based on forming a BSG layer on a substrate S3 (e.g., a silicon oxide substrate).

A dopant-containing layer 205 as shown in FIG. 9C may be formed through the process shown in FIG. 9A or 9B.

FIGS. 10A, 10B, 10C, 10D, and 10E are example views illustrating operation S210 of forming a crystalline silicon layer on a dopant-containing layer.

Figure 10A:
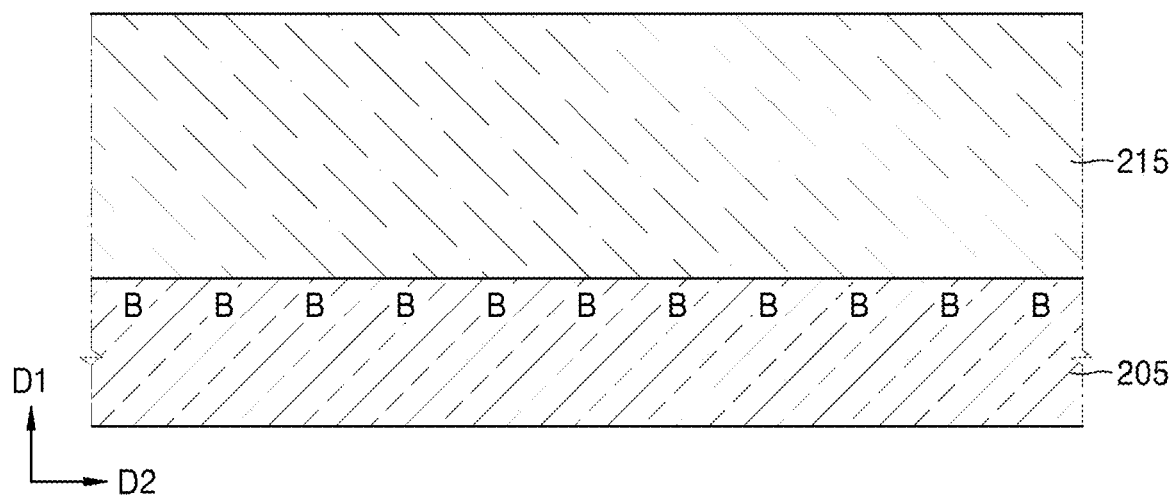
FIGS. 10A, 10B, 10C, 10D, and 10E are example views illustrating an operation of forming a crystalline silicon layer on the dopant-containing layer in the method of the meta optical device, according to some example embodiments.

Referring to FIG. 10A, a crystalline silicon layer 215 including a polycrystalline silicon material may be formed by depositing polycrystalline silicon (poly-Si) on the dopant-containing layer 205. The deposition may be performed by, but is not limited to, a low pressure chemical vapor deposition (LPCVD) method.

Figure 10B:
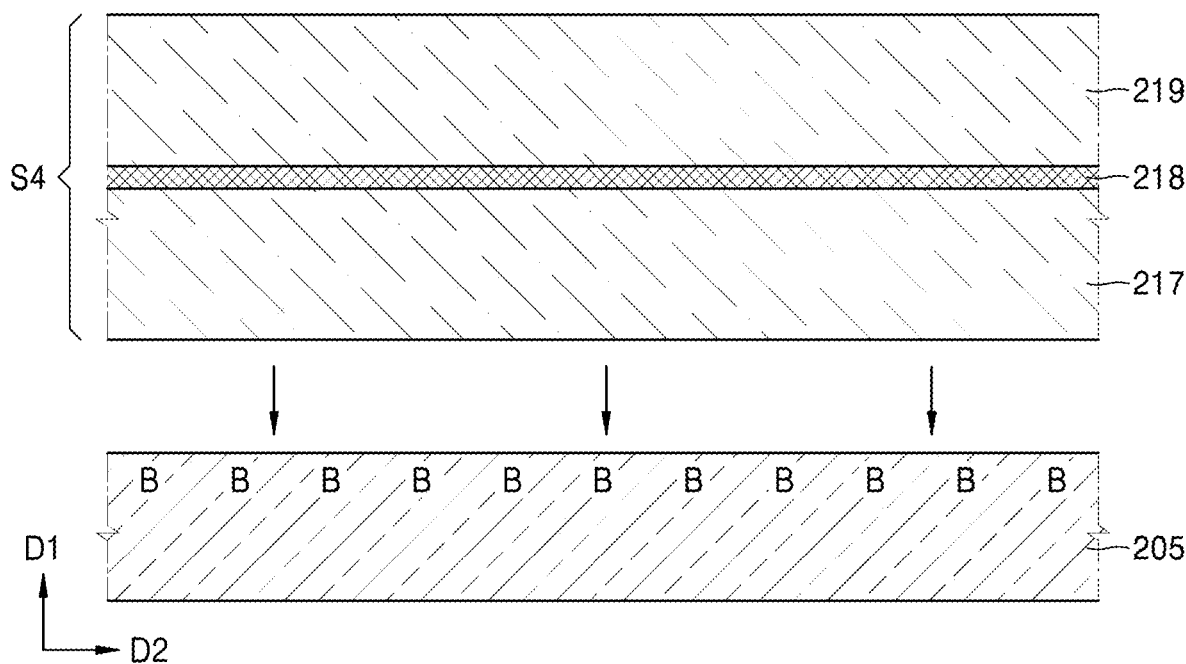

In some example embodiments, as shown in FIG. 10B, a silicon-on-insulator (SOI) substrate S4 may be used to form a crystalline silicon layer.

Figure 10C:
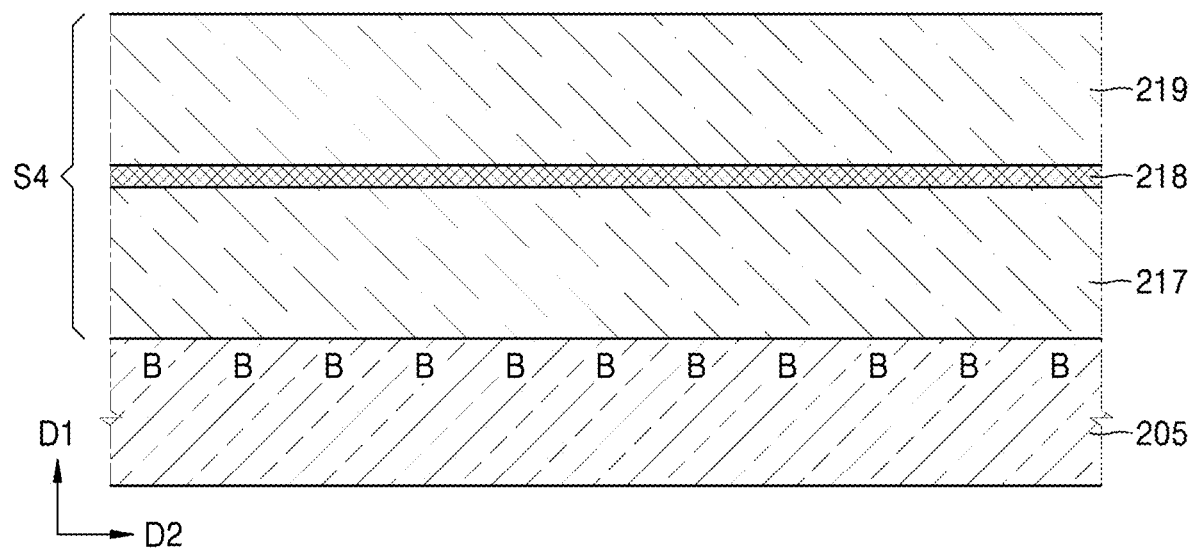

Referring to FIGS. 10B and 10C, the SOI substrate S4 includes a first monocrystalline silicon layer 217, an insulating material layer 218, and a second monocrystalline silicon layer 219. The SOI substrate S4 may be bonded onto the dopant-containing layer 205.

Prior to bonding the SOI substrate S4 onto the dopant-containing layer 205 by a wafer bonding method, an additional silicon oxide layer (not shown) may be deposited on the dopant-containing layer 205. The additional silicon oxide layer has a thickness of less than about 30 nm. Although the silicon oxide layer facilitates wafer bonding (e.g., the bonding of the SOI substrate S4 and the dopant-containing layer 205 together), the formation of the silicon oxide layer may be omitted.

Figure 10D:
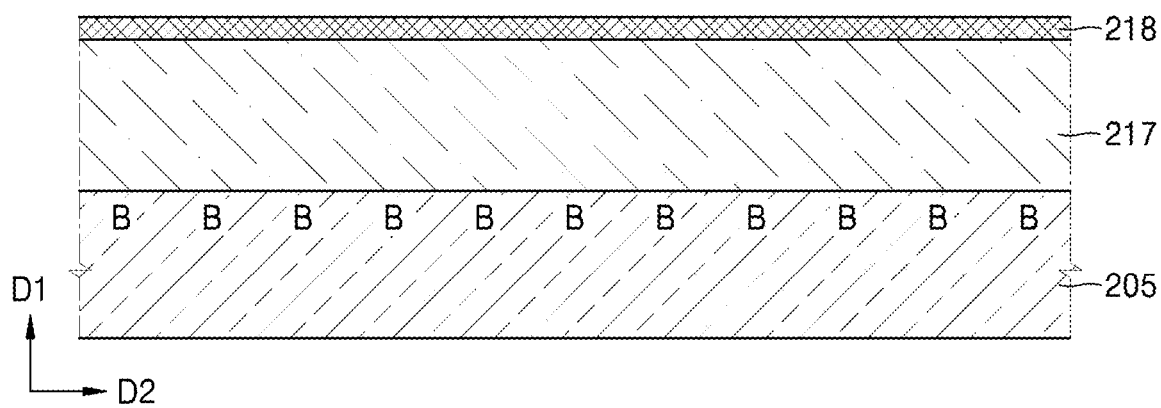

Next, the second monocrystalline silicon layer 219 may be removed from the structure shown in FIG. 10C (e.g., removed from the SOI substrate S4) to form the structure shown in FIG. 10D. This operation may be performed by polishing the second monocrystalline silicon layer 219.

Next, the insulating material layer 218 may be removed from the structure shown in FIG. 10D (e.g., removed from the SOI substrate S4). The insulating material layer 218 may include a silicon oxide material and may be removed by a wet etching method.

Figure 10E:
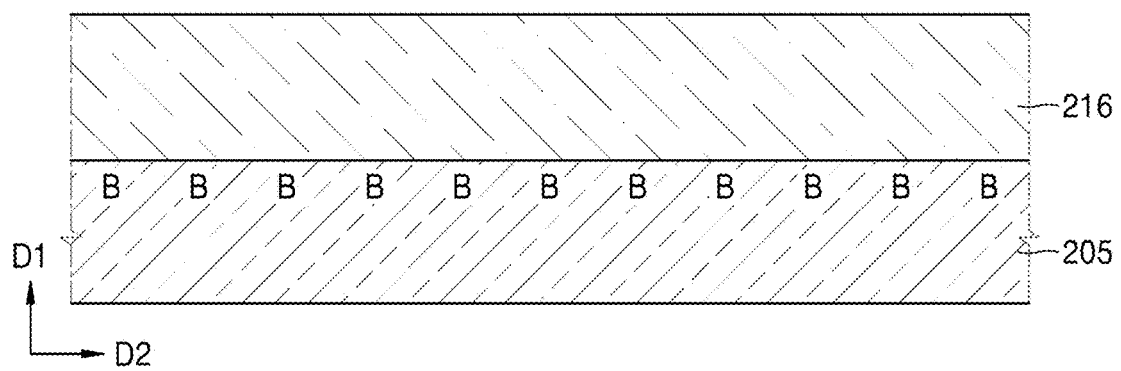

After wet etching, a portion of the first monocrystalline silicon layer 217 may be etched back, and as shown in FIG. 10E, a crystalline silicon layer 216 including a monocrystalline silicon material may be formed on the dopant-containing layer 205.

Figure 11A:
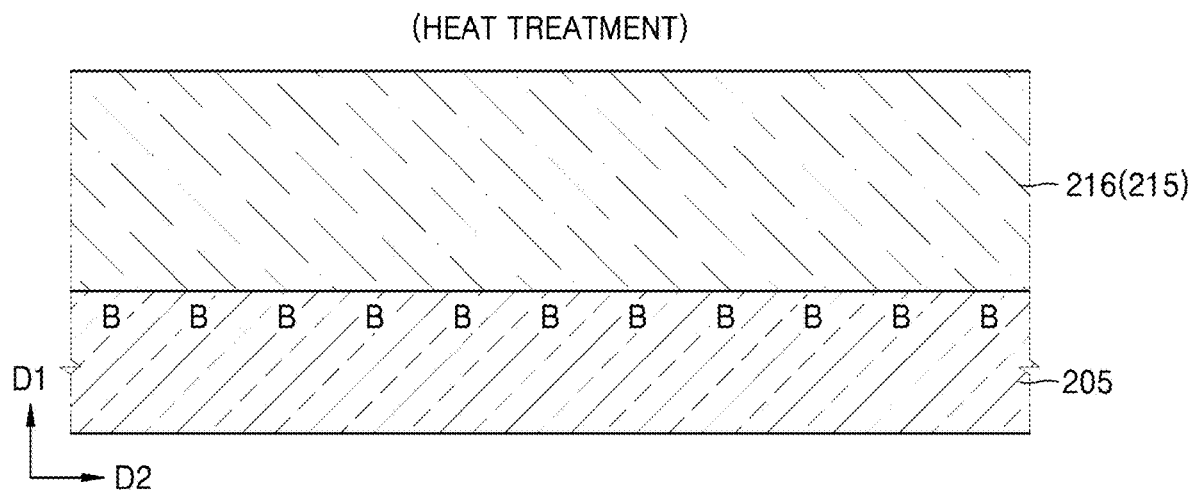
FIGS. 11A and 11B are example views illustrating an operation of forming a first conductivity type semiconductor layer in the method of the meta optical device, according to some example embodiments.
Figure 11B:
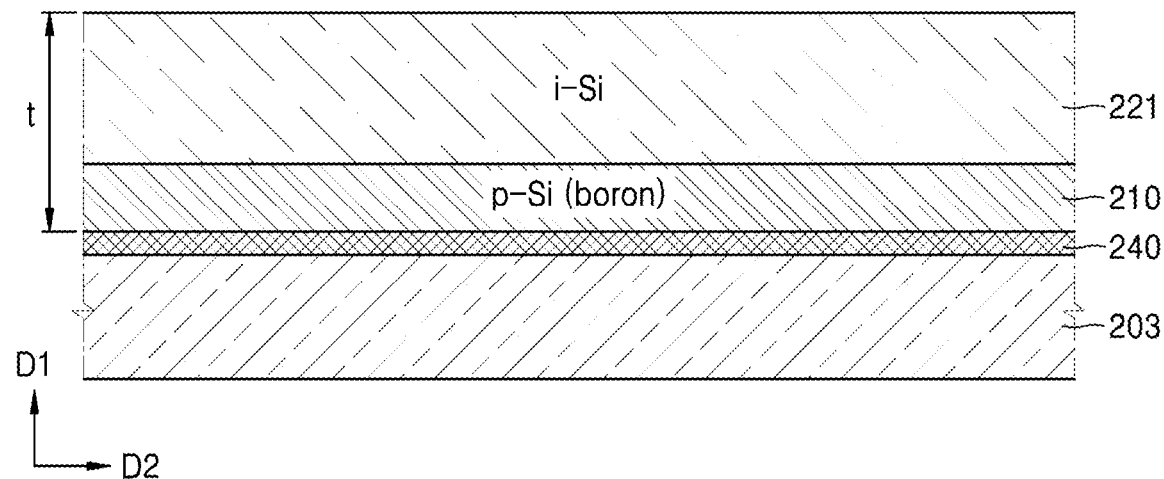

FIGS. 11A and 11B are example views illustrating operation S220 of forming a first conductivity type semiconductor layer by heat treatment.

Referring to FIG. 11A, a heat treatment process may be performed on the crystalline silicon layer 216 or the crystalline silicon layer 215 formed on the dopant-containing layer 205. The heat treatment process may be a rapid thermal process (RTP) and may be performed at a temperature of about 1000° C. for about 10 seconds to 60 seconds, but is not limited thereto.

The heat treatment process may diffuse and activate the first conductivity type dopant, for example, boron (B), which is contained in the dopant-containing layer 205, and thus, the first conductivity type dopant may move to a lower region of the crystalline silicon layer 216 or the crystalline silicon layers 215.

As a result, as shown in FIG. 11B, a structure may be formed, in which a first conductivity type semiconductor layer 210 such as a p-Si layer is arranged on a substrate 203, and a crystalline silicon layer 221 is arranged on the first conductivity type semiconductor layer 210.

The substrate 203 may include the same material as the substrate S3 used in the preparation of the dopant-containing layer 205, and may be, for example, a silicon oxide substrate.

The total thickness (t) of the first conductivity type semiconductor layer 210 and the crystalline silicon layer 221 may be less than about 200 nm. For example, the total thickness (t) may range from about 120 nm to about 150 nm. The doping concentration of the first conductivity type semiconductor layer 210 may range from about $1 \times 10^{17}$ atoms/cm$^3$ to about $1 \times 10^{22}$ atoms/cm$^3$.

As is described with FIGS. 3 and 4, a residual layer 240 may be formed between the substrate 203 and the first conductivity type semiconductor layer 210. The residual layer 240 may be, for example, a layer in which boron (B), that is, the first conductivity type dopant, is contained in SiO$_2$. In the following drawings, the residual layer 240 is not shown.

While the first conductivity type semiconductor layer 210 is formed, the interface between the first conductivity type semiconductor layer 210 and the crystalline silicon layer 221 is not exposed to the outside. Therefore, surface oxidation does not occur, and an oxidation-free junction structure may be formed.

Figure 12A:
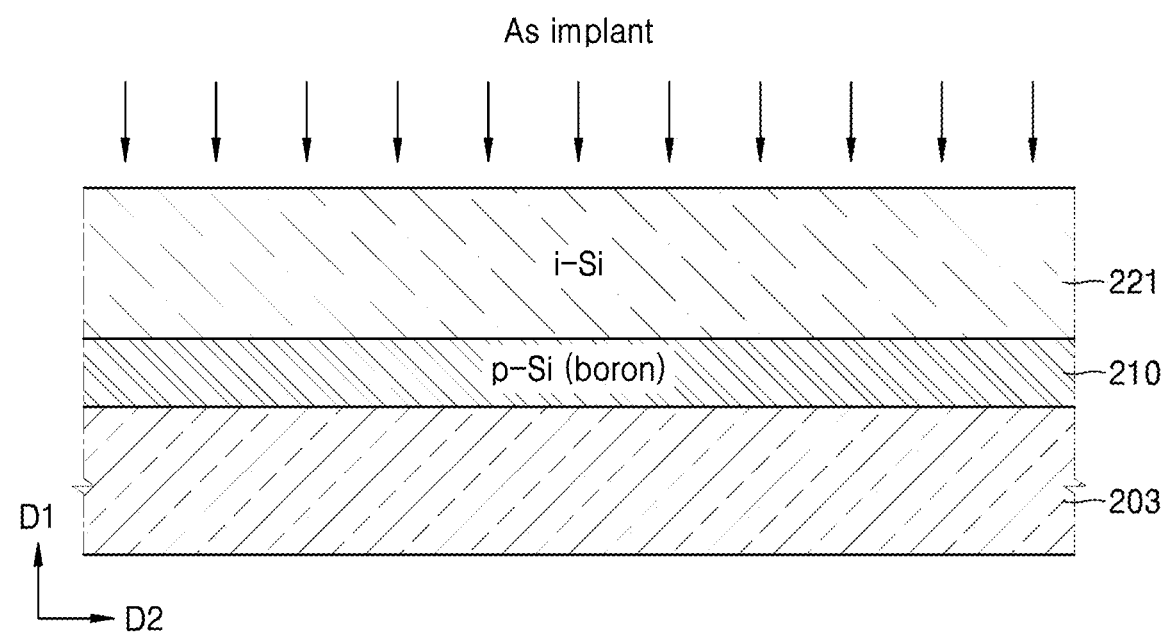
FIGS. 12A, 12B, and 12C are example views illustrating an operation of forming a second conductivity type semiconductor layer in the method of manufacturing the meta optical device, according to some example embodiments.
Figure 12B:
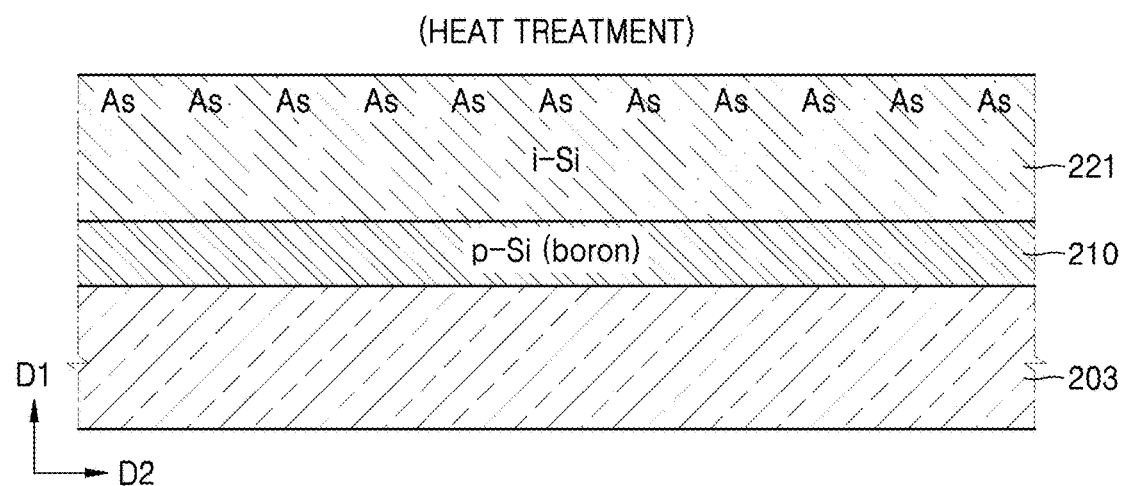
Figure 12C:
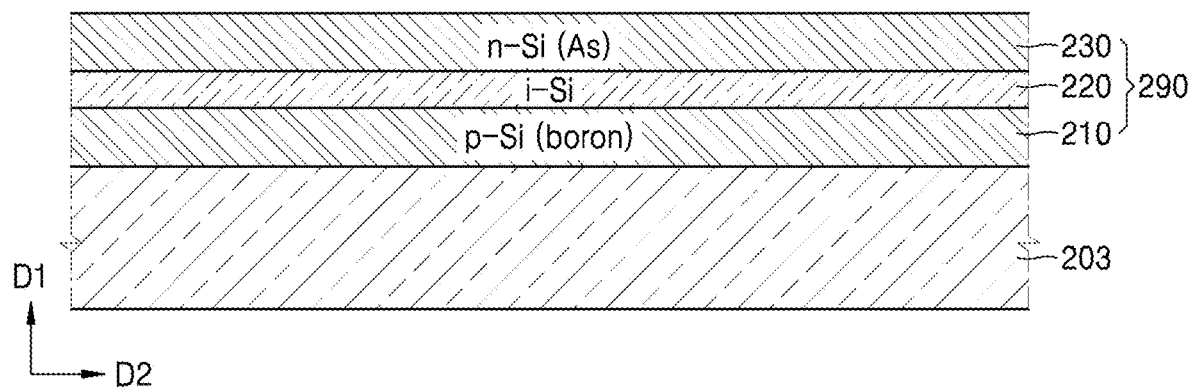

FIGS. 12A, 12B, and 12C are example views illustrating operation S240 of forming a second conductivity type semiconductor layer.

The structure shown in FIG. 12C, in which an intrinsic semiconductor layer 220 is arranged on the first conductivity type semiconductor layer 210, and a second conductivity type semiconductor layer 230 such as an n-Si layer is arranged on the intrinsic semiconductor layer 220, may be formed by implanting a second conductivity type dopant into the crystalline silicon layer 221 as shown in FIG. 12A and performing a heat treatment process on the crystalline silicon layer 221 that is implanted with the second conductivity type dopant as shown in FIG. 12B. The doping concentration of the second conductivity type semiconductor layer 230 may range from about $1 \times 10^{17}$ atoms/cm$^3$ to about $1 \times 10^{22}$ atoms/cm$^3$.

The second conductivity type dopant may be an n-type dopant such as arsenic (As), but is not limited thereto. The second conductivity type dopant may be an element having an atomic weight of about 70 or greater. This atomic weight condition is for adjusting the implantation depth of the second conductivity type dopant. The implantation depth of the second conductivity type dopant may be adjusted according to the thicknesses of the second conductivity type semiconductor layer 230 and the intrinsic semiconductor layer 220, and when the implantation depth of the second conductivity type dopant is excessive, it may be difficult to form the second conductivity type semiconductor layer 230 and the intrinsic semiconductor layer 220 having desired thicknesses. An element having an atomic weight of about 70 or greater may be selected as the second conductivity type dopant to appropriately limit the implantation depth of the second conductivity type dopant, and during the heat treatment process, the element may appropriately diffuse in the crystalline silicon layer 221 such that the second conductivity type semiconductor layers 230 and the intrinsic semiconductor layer 220 may have desired thicknesses.

While the second conductivity type semiconductor layers 230 is formed, the interface between the second conductivity type semiconductor layer 230 and the intrinsic semiconductor layer 220 is not exposed to the outside. Therefore, surface oxidation does not occur, and an oxidation-free junction structure may be formed.

FIGS. 13A, 13B, 13C, and 13D are example views illustrating operation S240 of forming a second conductivity type semiconductor layer.

Figure 13A:
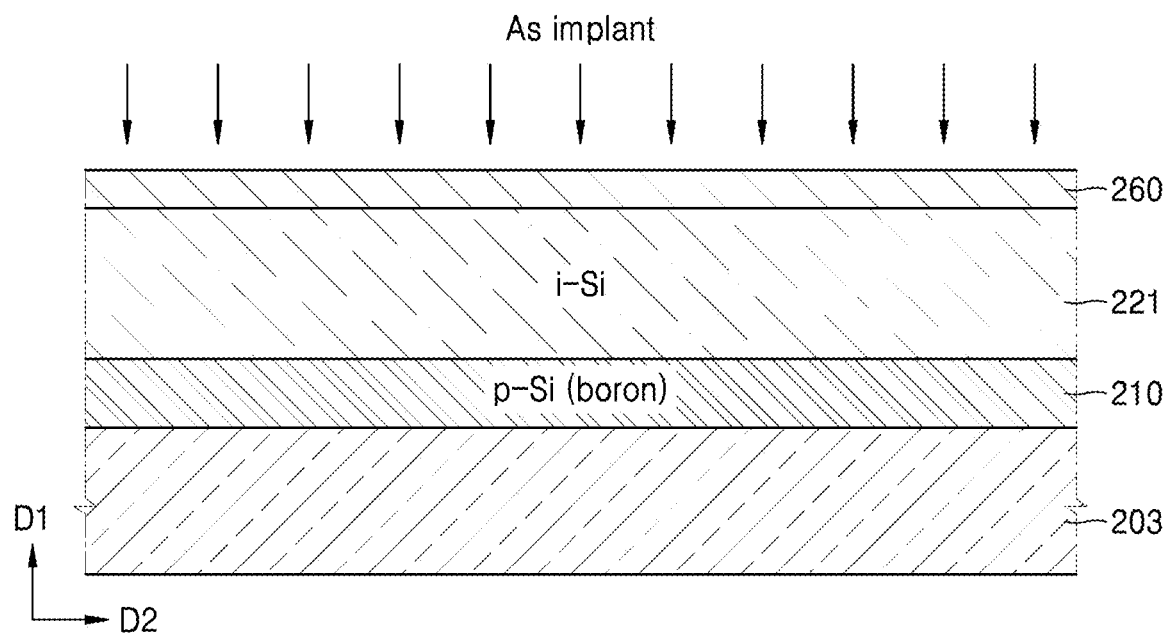
FIGS. 13A, 13B, 13C, and 13D are example views illustrating an operation of forming a second conductivity type semiconductor layer in the method of manufacturing the meta optical device, according to some example embodiments.

As shown in FIG. 13A, before implanting the second conductivity type dopant, a silicon oxide layer 260 may be formed on the crystalline silicon layer 221, and a second conductivity type dopant such as arsenic (As) may be implanted into the crystalline silicon layer 221 through the silicon oxide layer 260.

The silicon oxide layer 260 may be formed to a thickness of less than about 50 nm. The silicon oxide layer 260 is formed to control the implantation depth of the second conductivity type dopant. As described above, the implantation depth of the second conductivity type dopant may be adjusted to form a second conductivity type semiconductor layer 230 at an appropriate position with a desired thickness, and to this end, the silicon oxide layer 260 may be formed to an appropriate thickness. The silicon oxide layer 260 may be selectively or additionally formed when it is not easy to adjust the implantation depth of the second conductivity type dopant only by selecting an element having an atomic weight of about 70 or greater as the second conductivity type dopant as described with reference to FIG. 12A.

Figure 13B:
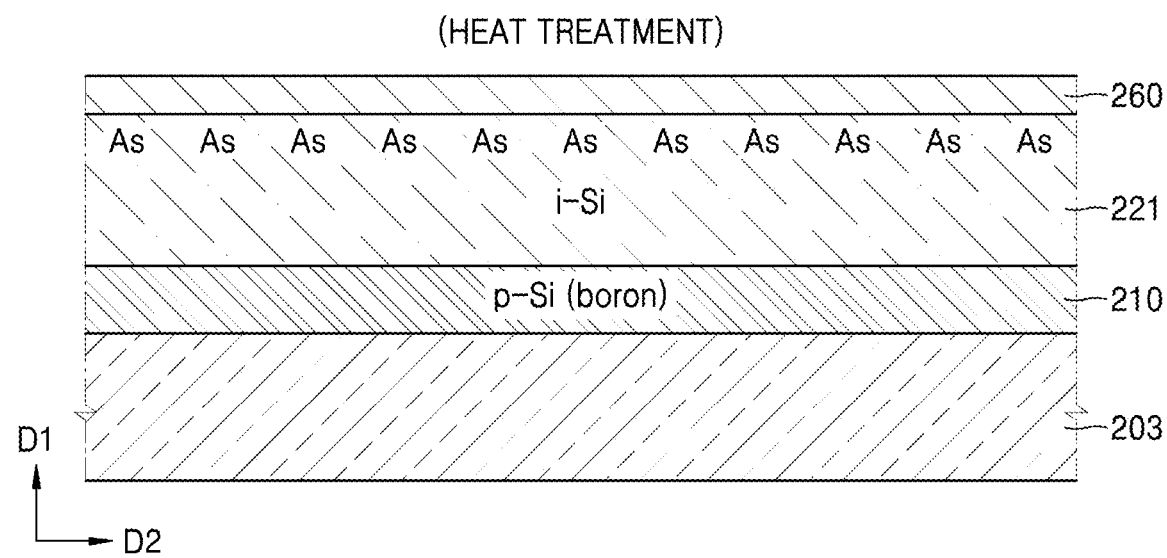
Figure 13C:
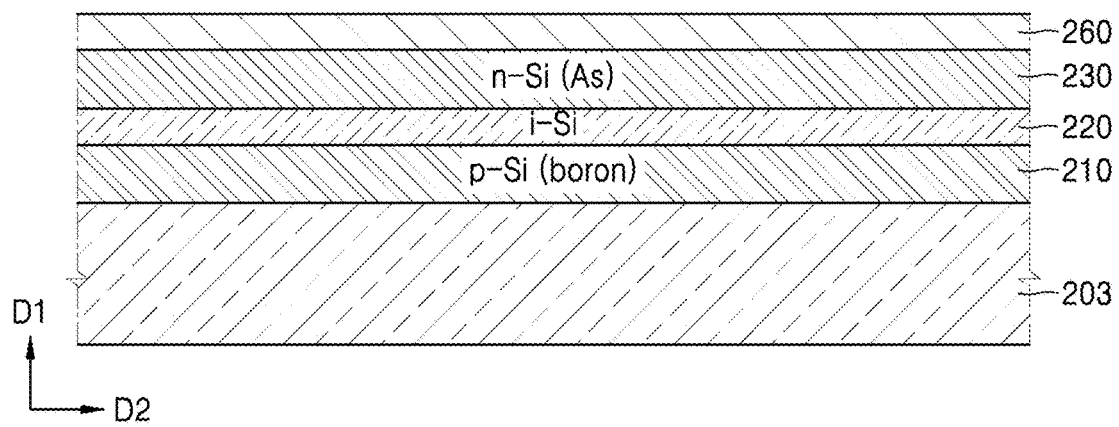

The second conductivity type dopant may be implanted into the crystalline silicon layer 221 through the silicon oxide layer 260, and then, as illustrated in FIG. 13B, a heat treatment process may be performed to form the structure shown in FIG. 13C in which an intrinsic semiconductor layer 220 such as an i-Si layer is arranged on the first conductivity type semiconductor layer 210, and the second conductivity type semiconductor layer 230 such as an n-Si layer is arranged on the intrinsic semiconductor layer 220.

Figure 13D:
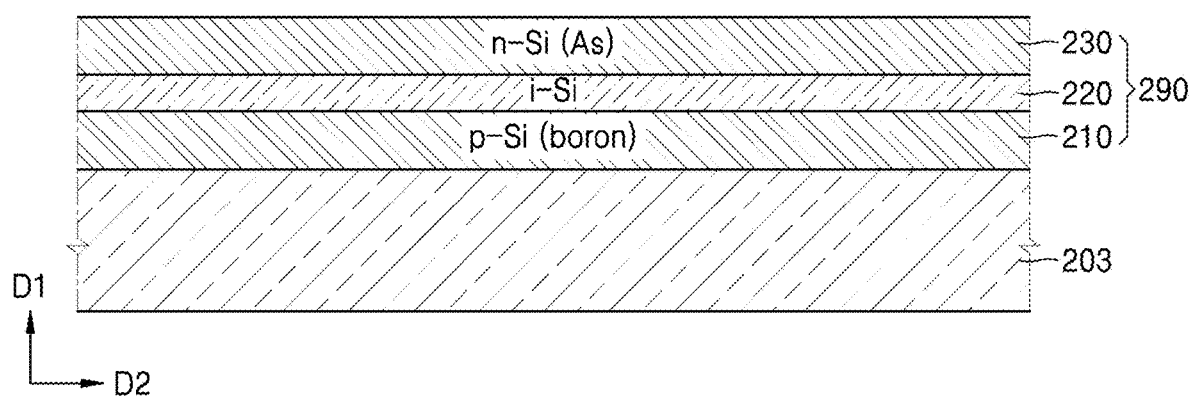

Next, the silicon oxide layer 260 may be removed, subsequently to the performing of the heat treatment process shown in FIG. 13B, to form a thin PIN film 290 as shown in FIG. 13D.

In the above description, the first conductivity type semiconductor layer 210 is illustrated as being of a p-type and the second conductivity type semiconductor layer 230 is illustrated as being of an n-type. However, the present disclosure is not limited thereto, and for example, the first conductivity type semiconductor layer 210 may be of an n-type and the second conductivity type semiconductor layer 230 may be of a p-type.

The total thickness of the thin PIN film 290 including the first conductivity type semiconductor layer 210, the intrinsic semiconductor layer 220, and the second conductivity type semiconductor layer 230 as shown in FIG. 12C or 13D may be a sub-wavelength dimension less than the wavelength of light to be sensed, and for example, the thin PIN film 290 may have a small thickness within the range of about 200 nm or less. According to the above-described manufacturing method, a thin junction (shallow junction) structure may be formed, in which no oxide interlayer oxide is formed on the interface between the first conductivity type semiconductor layer 210 and the intrinsic semiconductor layer 220 and the interface between the intrinsic semiconductor layer 220 and the second conductivity type semiconductor layers 230.

FIGS. 14A, 14B, 14C, and 14D are example views illustrating operation S250 in which the thin PIN film 290 manufactured as described above is patterned (e.g., the first conductivity type semiconductor layer 210, the crystalline silicon layer 221/intrinsic semiconductor layer 220, and the second conductivity type semiconductor layer 230 are patterned) to form a plurality of nanorods that are electrically isolated from each other (e.g., electrically insulated from each other, e.g., based on empty space between the nanorods). The nanorods (NR1, NR2, NR3) may have a shape distribution that causes the nanorods to be configured to function as lenses and color filters.

The thin PIN film 290 manufactured as shown in FIG. 12C or 13D may be patterned to form two or more nanorods having different widths.

Figure 14A:
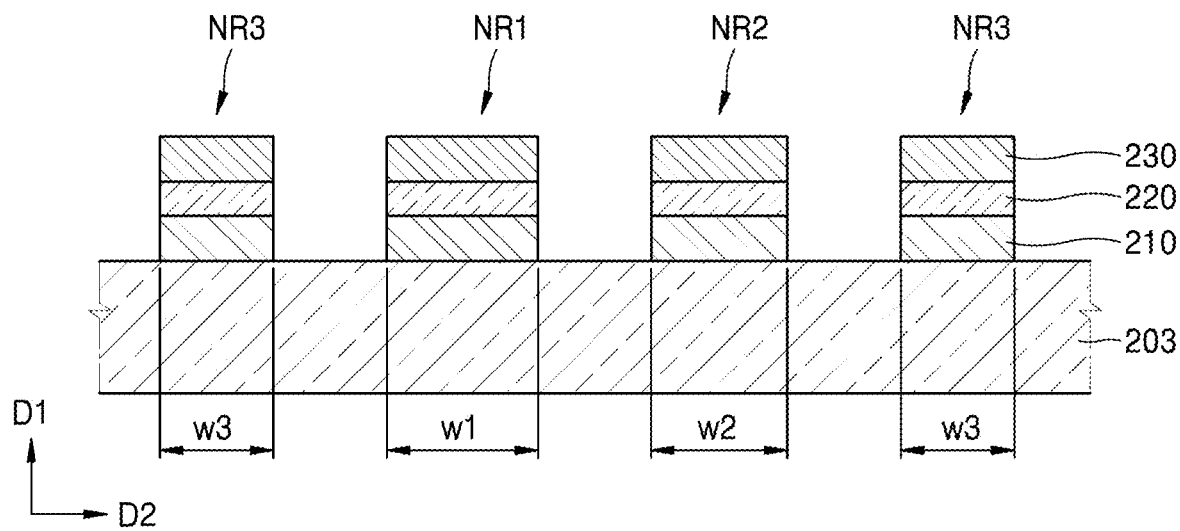
FIGS. 14A, 14B, 14C, and 14D are example views illustrating an operation of patterning a thin PIN film to form a plurality of nanorods in the method of manufacturing the meta optical device, according to some example embodiments.

As shown in FIG. 14A, for example, first nanorods NR1 having a first width w1, second nanorods NR2 having a second width w2, and third nanorods NR3 having a width w3 may be formed. The first, second, and third nanorods NR1, NR2, and NR3 may be repeatedly arranged in the form shown in FIG. 2. However, the first, second, and third nanorods NR1, NR2, and NR3 are not limited thereto. For example, the first, second, and third nanorods NR1, NR2, and NR3 may be arranged in another form such as a Bayer array pattern.

The first, second, and third nanorods NR1, NR2, and NR3 may each have a vertical PIN diode structure with a sub-wavelength shape dimension and may condense and sense different wavelengths of light. In the drawings, the three kinds of nanorods NR1, NR2, and NR3 having different widths are illustrated as being arranged in a repeating pattern, but the present disclosure is not limited thereto. For example, patterning may be performed to form two, four, or more kinds of nanorods having different widths.

Figure 14B:
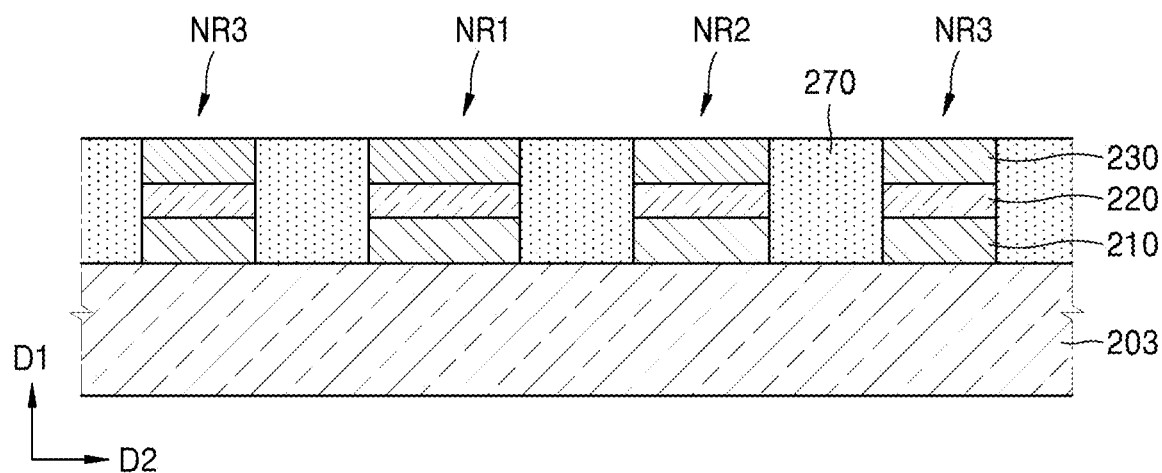

Next, referring to FIG. 14B, a cladding layer 270 may be further formed in a region between the first, second, and third nanorods NR1, NR2, and NR3. The cladding layer 270 may include a material having a refractive index less than the refractive index of the first, second, and third nanorods NR1, NR2, and NR3. The cladding layer 270 may include $SiO_2$, $Si_3N_4$, or $Al_2O_3$.

Figure 14C:
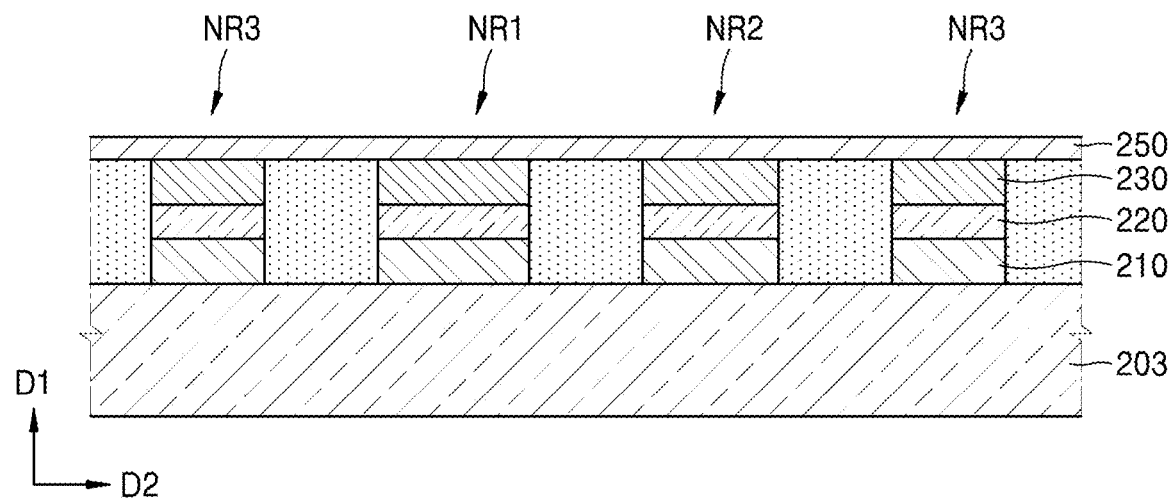

Next, referring to FIG. 14C, a common electrode layer 250 may be further formed on the first, second, and third nanorods NR1, NR2, and NR3.

The common electrode layer 250 may function as a common ground electrode for the first, second, and third nanorods NR1, NR2, and NR3. The common electrode layer 250 may include a transparent conductive material. For example, the common electrode layer 250 may include a transparent conductive oxide such as ITO, IZO, AZO, or GZO, or may include graphene.

Figure 14D:
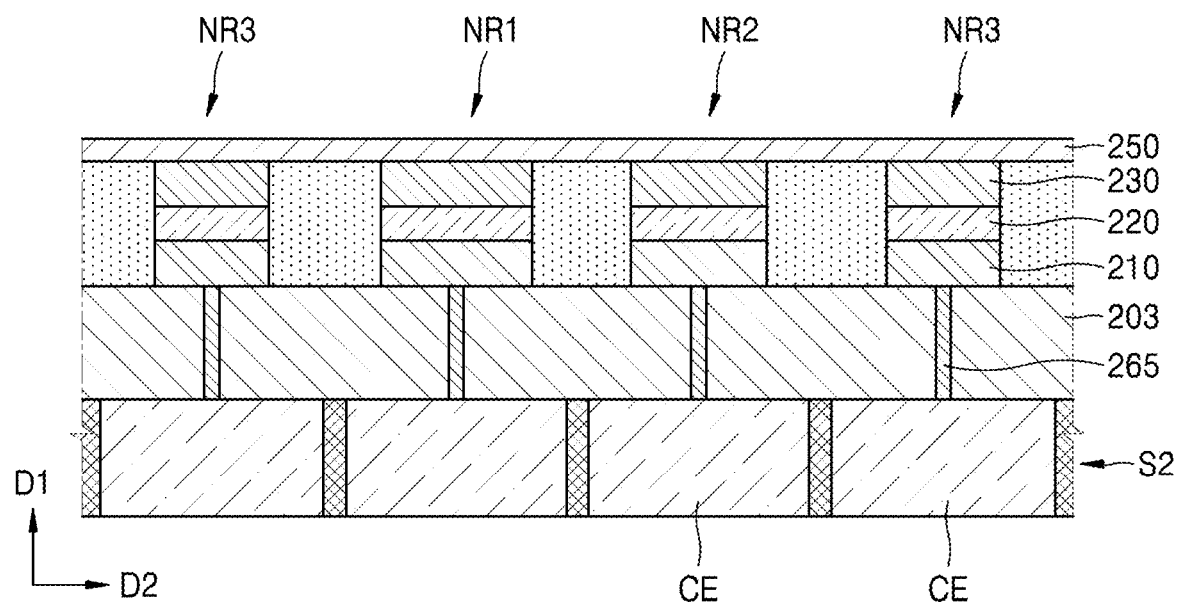

Referring to FIG. 14D, a readout circuit substrate S2 may be further provided, and circuit elements CE of the readout circuit substrate S2 may be respectively electrically connected to the first, second, and third nanorods NR1, NR2, and NR3. Conductive vias 265 may be formed through the substrate 203 to electrically connect the circuit elements CE to the first, second, and third nanorods NR1, NR2, and NR3.

The structure shown in FIG. 14D is similar to the structure of the meta optical device 103 shown in FIG. 5, and a structure similar to the structures of the meta optical devices 104 and 105 shown in FIGS. 6 and 7 may be formed from the structure shown in FIG. 14B.

The meta optical devices manufactured as described above may be used in various electronic devices such as image sensors, imaging devices, and object recognition devices.

The above-described meta optical devices are capable of distinguishing and detecting different wavelengths of light.

The meta optical devices may function as microlenses, color filters, and photodiodes and may be used as small, high-resolution image sensors.

According to the methods of manufacturing meta optical devices, a thin vertical-type PIN junction structure having no intermediate oxide interlayer may be formed. Thus, small, high-resolution images sensors may be manufactured.

It should be understood that example embodiments described herein should be considered in a descriptive sense only and not for purposes of limitation. Descriptions of features or aspects within each example embodiment should typically be considered as available for other similar features or aspects in other example embodiments. While the meta optical devices and methods of manufacturing the same have been described according to some example embodiments with reference to the accompanying drawings, some example embodiments are merely examples, and it will be understood by those of ordinary skill in the art that various modifications and other equivalent example embodiments may be made therein without departing from the spirit and scope of the present disclosure. Although many items have been stated in the above description, these should be considered as specific examples and should not be considered as limiting the scope of the present disclosure. Thus, the scope and spirit of the present disclosure should be defined not by the descriptions of some example embodiments but by the appended claims.

What is claimed is:

1. A meta optical device configured to sense incident light, the meta optical device comprising:
    a substrate;
    a plurality of nanorods on the substrate, each nanorod of the plurality of nanorods having a shape dimension less than a wavelength of the incident light, wherein each nanorod of the plurality of nanorods includes a stack, in a first direction away from the substrate, of
a first conductivity type semiconductor layer,
an intrinsic semiconductor layer, and
a second conductivity type semiconductor layer,
wherein the plurality of nanorods are formed based on a silicon semiconductor, such that each of the first conductivity type semiconductor layer, the intrinsic semiconductor layer, and the second conductivity type semiconductor layer includes silicon; and
a residual layer including $SiO_2$ and a first conductivity type dopant contained in the $SiO_2$, the residual layer being between the first conductivity type semiconductor layer and the substrate.

2. The meta optical device of claim 1, wherein the plurality of nanorods includes at least two nanorods having different cross-sectional widths in a second direction that is perpendicular to the first direction.

3. The meta optical device of claim 2, wherein the plurality of nanorods includes
a plurality of first nanorods each having a first width in a cross-section in the second direction;
a plurality of second nanorods each having a second width in a cross-section in the second direction; and
a plurality of third nanorods each having a third width in a cross-section in the second direction.

4. The meta optical device of claim 3, wherein
the plurality of first nanorods are configured to condense and sense light in a red wavelength band based on a magnitude of the first width,
the plurality of second nanorods are configured to condense and sense light in a green wavelength band based on a magnitude of the second width, and
the plurality of third nanorods are configured to condense and sense light in a blue wavelength band based on a magnitude of the third width.

5. The meta optical device of claim 4, wherein
the second width is greater than the third width, and
the first width is greater than the second width.

6. The meta optical device of claim 5, wherein the first width, the second width, and the third width each range from about 50 nm to about 200 nm.

7. The meta optical device of claim 4, wherein a distance between centers of two adjacent nanorods of the plurality of nanorods ranges from about 80 nm to about 500 nm.

8. The meta optical device of claim 4, wherein in a plan view perpendicular to the first direction, a unit structure is repeated in which any one nanorod of the plurality of first nanorods, the plurality of second nanorods, and the plurality of third nanorods are repeatedly arranged at a center and vertices of a hexagon.

9. The meta optical device of claim 8, wherein, in the unit structure, one first nanorod of the plurality of first nanorods is positioned at the center of the hexagon, and three second nanorods of the plurality of second nanorods and three third nanorods of the plurality of third nanorods are alternately arranged at six vertices of the hexagon.

10. The meta optical device of claim 1, wherein the plurality of nanorods have a height equal to or less than about 200 nm.

11. The meta optical device of claim 1, wherein the first conductivity type semiconductor layer and the second conductivity type semiconductor layer each have a doping concentration within a range of $1\times10^{17}$ atoms/cm$^3$ to about $1\times10^{22}$ atoms/cm$^3$.

12. The meta optical device of claim 1, wherein
the first conductivity type semiconductor layer includes a p-type semiconductor layer, and
the second conductivity type semiconductor layer includes an n-type semiconductor layer.

13. The meta optical device of claim 12, wherein an n-type dopant included in the second conductivity type semiconductor layer includes an element having an atomic weight equal to or greater than about 70.

14. The meta optical device of claim 13, wherein the n-type dopant includes arsenic (As) or antimony (Sb).

15. The meta optical device of claim 1, further comprising:
a cladding layer between the plurality of nanorods and surrounding the plurality of nanorods, the cladding layer including a material having a lower refractive index than respective refractive indices of the plurality of nanorods.

16. The meta optical device of claim 15, wherein the cladding layer includes $SiO_2$, $Si_3N_4$, or $Al_2O_3$.

17. The meta optical device of claim 1, further comprising:
a common electrode layer that is in contact with the second conductivity type semiconductor layers of the plurality of nanorods.

18. The meta optical device of claim 17, wherein the substrate includes a readout circuit substrate including a plurality of transistors electrically connected to separate, respective nanorods of the plurality of nanorods.

19. An electronic device comprising the meta optical device of claim 1.

20. A meta optical device configured to sense incident light, the meta optical device comprising:
a substrate;
a plurality of nanorods on the substrate, each nanorod of the plurality of nanorods having a shape dimension less than a wavelength of the incident light,
wherein each nanorod of the plurality of nanorods includes a stack, in a first direction away from the substrate, of
a first conductivity type semiconductor layer,
an intrinsic semiconductor layer, and
a second conductivity type semiconductor layer,
wherein the substrate includes a readout circuit substrate including a plurality of transistors electrically connected to separate, respective nanorods of the plurality of nanorods;
a common electrode layer that is in contact with the second conductivity type semiconductor layers of the plurality of nanorods;
an isolation layer between the readout circuit substrate and the plurality of nanorods, the isolation layer including a material which has a lower refractive index than respective refractive indices of the plurality of nanorods; and
conductive vias penetrating the isolation layer and electrically connecting the respective nanorods of the plurality of nanorods to respective transistors of the plurality of transistors of the readout circuit substrate.

21. The meta optical device of claim 20,
wherein each of the conductive vias electrically connects respective transistors of the plurality of transistors of the readout circuit substrate to respective first conductivity type semiconductor layers of respective nanorods of the plurality of nanorods.

22. The meta optical device of claim 20, further comprising:

a plurality of lower electrode layers that are in contact with lower surfaces of the first conductivity type semiconductor layers of respective nanorods of the plurality of nanorods; and wherein each of the conductive vias electrically connects respective transistors of the plurality of transistors of the readout circuit substrate to respective lower electrode layers of the lower electrode layers.

* * * * *